US009312773B2

(12) United States Patent
Li

(10) Patent No.: US 9,312,773 B2
(45) Date of Patent: Apr. 12, 2016

(54) BOOTSTRAP REFRESH CONTROL CIRCUIT, POWER CONVERTER AND ASSOCIATED METHOD

(71) Applicant: Monolithic Power Systems, Inc., San Jose, CA (US)

(72) Inventor: Yike Li, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 242 days.

(21) Appl. No.: 14/015,964

(22) Filed: Aug. 30, 2013

(65) Prior Publication Data

US 2015/0061611 A1    Mar. 5, 2015

(30) Foreign Application Priority Data

Aug. 30, 2013 (CN) .............................. 2012103 15162

(51) Int. Cl.
*H02M 3/158* (2006.01)
*H03K 17/06* (2006.01)

(52) U.S. Cl.
CPC ........... *H02M 3/1588* (2013.01); *H03K 17/063* (2013.01); *H03K 2217/0063* (2013.01); *H03K 2217/0081* (2013.01)

(58) Field of Classification Search
CPC ....................................................... H02M 1/08
See application file for complete search history.

(56) References Cited

U.S. PATENT DOCUMENTS

| 5,627,460 | A | * | 5/1997 | Bazinet et al. | ................. | 323/288 |
| 5,838,117 | A | * | 11/1998 | Nerone | .......................... | 315/307 |
| 6,211,623 | B1 | * | 4/2001 | Wilhelm et al. | ............... | 315/224 |
| 8,502,511 | B1 | * | 8/2013 | Kung | ............................. | 323/225 |
| 8,558,526 | B2 | * | 10/2013 | Ishii | ................................ | 323/283 |
| 2002/0089860 | A1 | * | 7/2002 | Kashima et al. | ................ | 363/13 |
| 2005/0212502 | A1 | * | 9/2005 | Casey et al. | .................... | 323/284 |
| 2005/0285585 | A1 | * | 12/2005 | Noma | ............................ | 323/284 |
| 2006/0002159 | A1 | * | 1/2006 | Lin et al. | .......................... | 363/95 |
| 2007/0013353 | A1 | * | 1/2007 | Noma | ............................ | 323/284 |
| 2007/0046275 | A1 | * | 3/2007 | Shirai et al. | ..................... | 323/284 |
| 2007/0120547 | A1 | * | 5/2007 | Tateishi et al. | ................ | 323/282 |
| 2007/0170902 | A1 | * | 7/2007 | Chen et al. | ..................... | 323/282 |
| 2008/0084243 | A1 | * | 4/2008 | Kanamori et al. | ............ | 327/589 |
| 2008/0278135 | A1 | * | 11/2008 | De Lima Filho et al. | ..... | 323/288 |
| 2009/0108908 | A1 | * | 4/2009 | Yamadaya | ..................... | 327/390 |
| 2010/0072968 | A1 | * | 3/2010 | Bianco et al. | ................. | 323/284 |
| 2010/0079127 | A1 | * | 4/2010 | Grant | ............................ | 323/285 |
| 2010/0231187 | A1 | * | 9/2010 | Wicht et al. | .................... | 323/282 |
| 2010/0259238 | A1 | * | 10/2010 | Cheng | ........................... | 323/282 |
| 2010/0320983 | A1 | * | 12/2010 | Wu | ................................. | 323/283 |
| 2011/0018516 | A1 | * | 1/2011 | Notman et al. | ............... | 323/284 |
| 2011/0080205 | A1 | * | 4/2011 | Lee | ................................. | 327/390 |

(Continued)

*Primary Examiner* — Timothy J Dole
*Assistant Examiner* — Yusef Ahmed
(74) *Attorney, Agent, or Firm* — Perkins Coie LLP

(57) ABSTRACT

A power converter having a bootstrap refresh control circuit and a method for controlling the power converter. The bootstrap refresh control circuit is configured to monitor a bootstrap voltage across a bootstrap capacitor and to provide an enhanced high side driving signal to a high side switch of the power converter. The bootstrap refresh control circuit is further configured to controlling the charging of the bootstrap capacitor through regulating the on and off switching of the high side switch and a low side switch based on the bootstrap voltage. The bootstrap refresh control circuit can refresh the bootstrap voltage in time to support driving the high side switch normally, without causing large spikes in an output voltage of the power converter and without influencing the power conversion efficiency of the power converter.

17 Claims, 5 Drawing Sheets

(56) References Cited

U.S. PATENT DOCUMENTS

| | | |
|---|---|---|
| 2011/0133711 A1* | 6/2011 | Murakami et al. ............ 323/282 |
| 2012/0049829 A1* | 3/2012 | Murakami ..................... 323/288 |
| 2012/0212863 A1* | 8/2012 | Ando ............................... 361/45 |
| 2013/0187626 A1* | 7/2013 | Su et al. ......................... 323/311 |
| 2013/0265016 A1* | 10/2013 | Chang et al. .................. 323/271 |
| 2013/0265024 A1* | 10/2013 | Chen .............................. 323/282 |
| 2013/0293214 A1* | 11/2013 | Chang et al. .................. 323/311 |
| 2013/0308061 A1* | 11/2013 | Murakami et al. ............ 348/730 |
| 2014/0015503 A1* | 1/2014 | Cheng ............................ 323/282 |
| 2014/0043875 A1* | 2/2014 | Hsing et al. ..................... 363/77 |
| 2014/0077790 A1* | 3/2014 | Sohma ........................... 323/313 |
| 2014/0160601 A1* | 6/2014 | Ouyang .......................... 361/18 |
| 2014/0292292 A1* | 10/2014 | Koski ............................. 323/271 |
| 2015/0028830 A1* | 1/2015 | Chen ............................... 323/271 |

\* cited by examiner

BOOTSTRAP REFRESH CONTROL CIRCUIT, POWER CONVERTER AND ASSOCIATED METHOD

CROSS-REFERENCE TO RELATED APPLICATION(S)

This application claims the benefit of CN Application No. 201210315162.5, filed on Aug. 30, 2012, and incorporated herein by reference.

TECHNICAL FIELD

This disclosure relates generally to power converters, and more particularly but not exclusively relates to switching power converters and bootstrap refresh.

BACKGROUND

Power converters such as switch-mode voltage regulators are widely used in various electronic devices for sourcing power to the electronic devices from a power source. Taking a buck type switching regulator for example, the buck switching regulator generally has relatively high conversion efficiency, wide bandwidth and good loop stability with sample loop compensation, and is thus popular in converting high input voltage to relatively low output voltage applications. FIG. 1 illustrates schematically a typical buck type DC-DC voltage converter 50. In brief, the voltage converter 50 is configured to receive an input voltage Vin at its input terminal IN, and convert the input voltage Vin into an appropriate output voltage Vo through controlling a high side switch $M_{HS}$ and a low side switch $M_{LS}$ to switch on and off in a complementary manner. The voltage converter 50 comprises a control circuit 51 for providing control signals to the high side switch $M_{HS}$ and the low side switch $M_{LS}$. The high side switch $M_{HS}$ and the low side switch $M_{LS}$ are connected in series between the input terminal IN and reference ground GND, the common connection SW (also referred to as switching voltage output node SW) is coupled to an output terminal OUT of the voltage converter 50 via an inductive energy storage component Lo. A capacitive energy storage component Co is coupled between the output terminal OUT and the reference ground GND to smooth the output voltage Vo.

The high side switch $M_{HS}$ may comprise an N-channel power switching device, such as an N-channel FET or an N-channel DMOS etc. to save chip area, reduce the size and improve the performance of the voltage converter 50. In this situation, in order to make the high side switch $M_{HS}$ to be fully turned on (i.e., to make the high side switch $M_{HS}$ to operate in saturation region in which the switch $M_{HS}$ has a quite small on resistance), a voltage applied between a control terminal and a terminal connected to the node SW of the high side switch $M_{HS}$ must be large enough, at least larger than a turn on threshold voltage of the switch $M_{HS}$. For instance, in the example where the high side switch is a FET/DMOS, the voltage between a gate terminal and a source terminal (connected to the node SW) of the FET/DMOS must be larger than a turn on threshold of the FET/DMOS. However, when the high side switch $M_{HS}$ is on, the voltage at the node SW can reach the input voltage Vin, and thus a voltage higher than the input voltage Vin must be provided to the control terminal of the high side switch $M_{HS}$ so as to turn it on completely.

Therefore, in order to generate a voltage higher than the input voltage Vin, the voltage converter 50 generally further comprises a bootstrap circuit 52. The bootstrap circuit 52 is configured to provide a bootstrap voltage $V_{BST}$ referenced to the voltage at the node SW. The bootstrap voltage $V_{BST}$ can be used to enhance the driving capability of the control signal $DR_H$ provided to the control terminal of the high side switch $M_{HS}$, so that the control signal $DR_H$ can drive the high side switch $M_{HS}$ to turn on and off in good condition. In the example of FIG. 1, the bootstrap circuit 52 is illustrated to comprise a diode DB and a bootstrap capacitor CB connected in series between a bootstrap supply terminal VB and the switching voltage output node SW, wherein a cathode of the diode DB is connected to the bootstrap supply terminal VB, an anode of the diode DB is connected to a first terminal of the bootstrap capacitor CB, and a second terminal of the bootstrap capacitor CB is connected to the node SW. The bootstrap supply terminal VB is configured to receive a bootstrap supply voltage, and a voltage across the capacitor CB is provided as the bootstrap voltage $V_{BST}$. The operating principles of the bootstrap circuit 52 can be easily understood by the ordinary artisan. When the high side switch $M_{HS}$ is turned off and the low side switch $M_{LS}$ is turned on, the bootstrap capacitor CB is charged by the bootstrap supply voltage till the voltage across the bootstrap capacitor CB reaches the bootstrap voltage $V_{BST}$. When the high side switch $M_{HS}$ is turned on and the low side switch $M_{LS}$ is turned off, the input voltage Vin of the voltage converter 50 is transmitted to the switching voltage output node SW, i.e., the voltage at the second terminal of the bootstrap capacitor CB is pulled up to the input voltage Vin. Thus, the voltage at the first terminal of the bootstrap capacitor CB is raised to a voltage higher than the input voltage Vin, substantially equals to the input voltage Vin superposing the bootstrap voltage $V_{BST}$. As the voltage at the first terminal of the bootstrap capacitor CB reaches to the input voltage Vin plus the bootstrap voltage $V_{BST}$, the diode DB is reversely biased and is thus turned off so as to protect the bootstrap supply voltage source from being damaged by the relatively higher input voltage Vin.

In view of the above, it can be understood that the bootstrap capacitor CB can not be charged/recharged to refresh the bootstrap voltage $V_{BST}$ unless the low side switch $M_{LS}$ is turned on. However, in certain circumstances, the bootstrap capacitor CB may not have enough charge stored and may not be charged/recharged in time, resulting in the bootstrap voltage $V_{BST}$ to be decreased, which may cause the control signal $DR_H$ to not be able to drive the high side switch $M_{HS}$ to turn on and off properly. In such a situation, the voltage converter 50 will no longer be able to operate normally, which is not desired. For example, when the voltage converter 50 operates in light load or no load condition, the control circuit 51 is configured to reduce the on time and/or the switching frequency of the high side switch $M_{HS}$ and the low side switch $M_{LS}$ to improve the conversion efficiency of the converter 50. However, this may lead to the capacitor CB not being able to be charged/recharged in time because the on time of the low side switch $M_{LS}$ is too short or the high side switch $M_{HS}$ and the low side switch $M_{LS}$ do not switch in a relatively long time. In other circumstance, for example, if the desired value of the output voltage Vo is close to the input voltage Vin, the high side switch $M_{HS}$ has to operate in quite high duty cycle or 100% duty cycle, wherein the duty cycle refers to a percentage of the on time of the high side switch $M_{HS}$ in the switching cycle of the switches $M_{HS}$ and $M_{LS}$. In this case, the on time of the low side switch $M_{LS}$ in one switching cycle may be quite short or the low side switch $M_{LS}$ may even have no chance to turn on, resulting that the bootstrap capacitor CB can not be charged/recharged in time to store enough electrical charges to provide a high enough bootstrap voltage $V_{BST}$. The bootstrap capacitor CB should wait till the output voltage Vo drops, which implies that the duty cycle decreases and the on time of the low side switch $M_{LS}$ increases, in order to be charged/recharged so as to refresh the bootstrap voltage $V_{BST}$ (i.e., to make the bootstrap voltage $V_{BST}$ restore to a high enough value). However, this event can result in large spikes in the output voltage Vo. For example, supposing the converter 50 has a 6V input voltage Vin and a 3.3V desired output voltage Vo, a 3V bootstrap voltage $V_{BST}$ is required to ensure the high side switch $M_{HS}$ to be turned on and off normally. In this example, if an output current drawn from the converter 50 by a load is relatively small or no output current is drawn (i.e., the converter 50 operates in light load or no load condition), the bootstrap voltage $V_{BST}$ will decrease to lower than 2.7V, inducing the high side switch $M_{HS}$ not being able to turn on normally. The bootstrap capacitor CB should wait until the output voltage Vo decreases to lower than 3V in order to be recharged so that the bootstrap voltage $V_{BST}$ can refresh/restore to 3V. Then, the high side switch $M_{HS}$ and the low side switch $M_{LS}$ can switch normally to regulate the output voltage Vo to resume to its desired value 3.3V. However, each time the output voltage Vo resumes from lower than 3V to 3.3V, a large spike occurs, which is harmful to the converter 50 and the load, and thus is undesirable.

A need therefore exists for solving the problem of refreshing the bootstrap voltage $V_{BST}$ timely in power converters.

SUMMARY

In accomplishing the above and other objects, there has been provided, in accordance with an embodiment of the present disclosure, a bootstrap refresh control circuit for a power converter, wherein the power converter comprises a high side switch, a low side switch and a bootstrap capacitor for providing a bootstrap voltage to supply a high side driver of the high side switch, and wherein the power converter is configured to receive an input voltage and to provide an output voltage and an output current based on driving the high side switch and the low side switch to switch on and off. The bootstrap refresh control circuit may include a first comparison module having a first comparing input terminal, a second comparing input terminal and a first comparing output terminal. The first comparing input terminal is configured to receive the bootstrap voltage, the second comparing input terminal is configured to receive a first threshold signal, and the first comparison module is configured to compare the bootstrap voltage with the first threshold signal to provide a bootstrap refresh signal at the first comparing output terminal. The bootstrap refresh control circuit may further include a control module having a first control input terminal configured to receive the bootstrap refresh signal, wherein the control module is configured to regulate the on and off switching of the high side switch and the low side switch at least partially based on the bootstrap refresh signal so as to control charging of the bootstrap capacitor.

There has also been provided, in accordance with an embodiment of the present disclosure, a power converter. The power converter may have an input port configured to receive an input voltage, and an output port configured to provide an output voltage and an output current to supply a load. The power converter may comprise a high side switch and a low side switch coupled in series between the input port and a reference ground, wherein the high side switch and the low side switch has a common connection forming a switching output terminal configured to provide a switching voltage. The power converter may further comprise an output filter coupled between the switching output terminal and the output port to convert the switching voltage into the smoothed output voltage. The power converter may further comprise a bootstrap circuit and a bootstrap refresh control circuit. The bootstrap circuit may comprise a bootstrap capacitor coupled to the input port and the low side switch, wherein the bootstrap circuit is configured to charge the bootstrap capacitor to provide a bootstrap voltage when the low side switch is turned on. The bootstrap refresh control circuit may have a bootstrap input terminal configured to receive the bootstrap voltage, and an output control terminal configured to provide an enhanced high side driving signal to the high side switch for driving the high side switch to switch on and off periodically, wherein the bootstrap refresh control circuit is further configured to controlling the charging of the bootstrap capacitor through regulating the on and off switching of the high side switch and the low side switch based on the bootstrap voltage.

There has also been provided, in accordance with an embodiment of the present disclosure, a method for controlling a power converter, wherein the power converter comprises a high side switch, a low side switch and a bootstrap capacitor for providing a bootstrap voltage to supply a high side driver of the high side switch, and wherein the power converter is configured to receive an input voltage and to provide an output voltage and an output current based on driving the high side switch and the low side switch to switch on and off. The method may comprise: sensing the bootstrap voltage across the bootstrap capacitor; comparing the bootstrap voltage with a first threshold signal to provide a bootstrap refresh signal based on the comparison of the bootstrap voltage and the first threshold signal; and regulating the on and off switching of the high side switch and the low side switch based at least partially on the bootstrap refresh signal in order to control charging of the bootstrap capacitor to refresh the bootstrap voltage.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
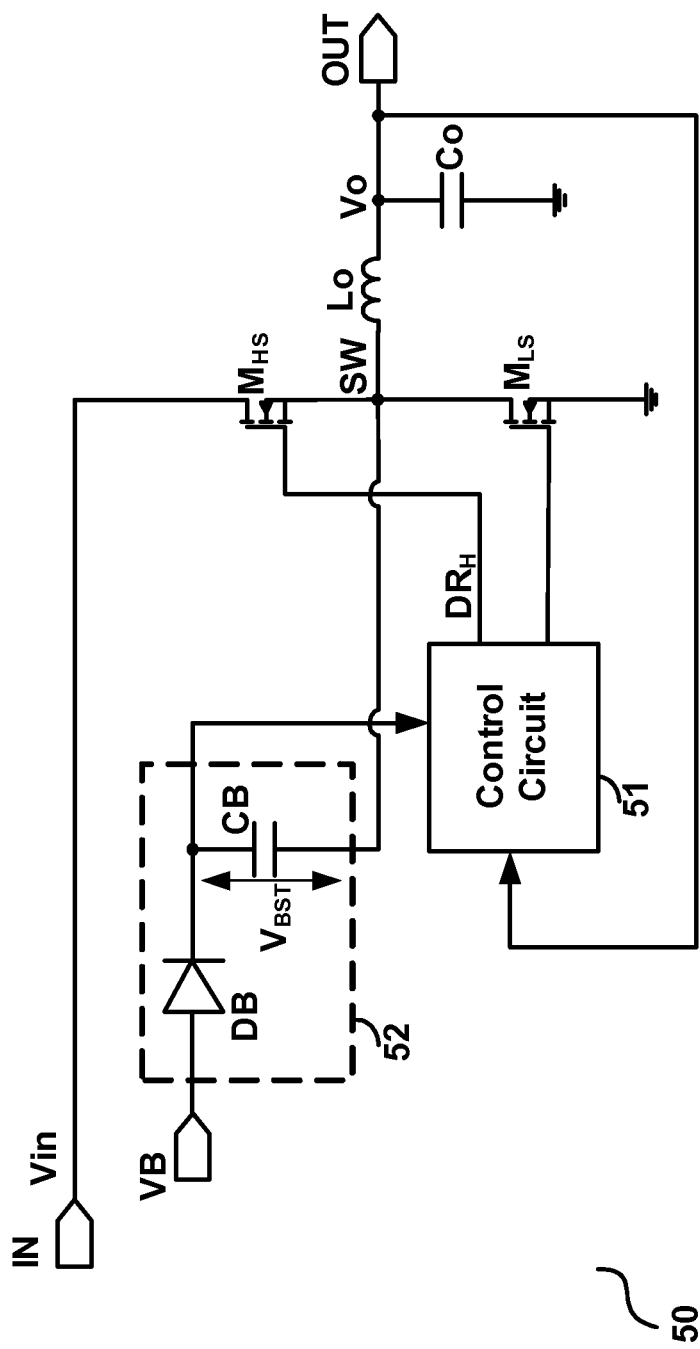
FIG. 1 illustrates a block diagram of a typical buck type DC-DC voltage converter 50.
Figure 2:
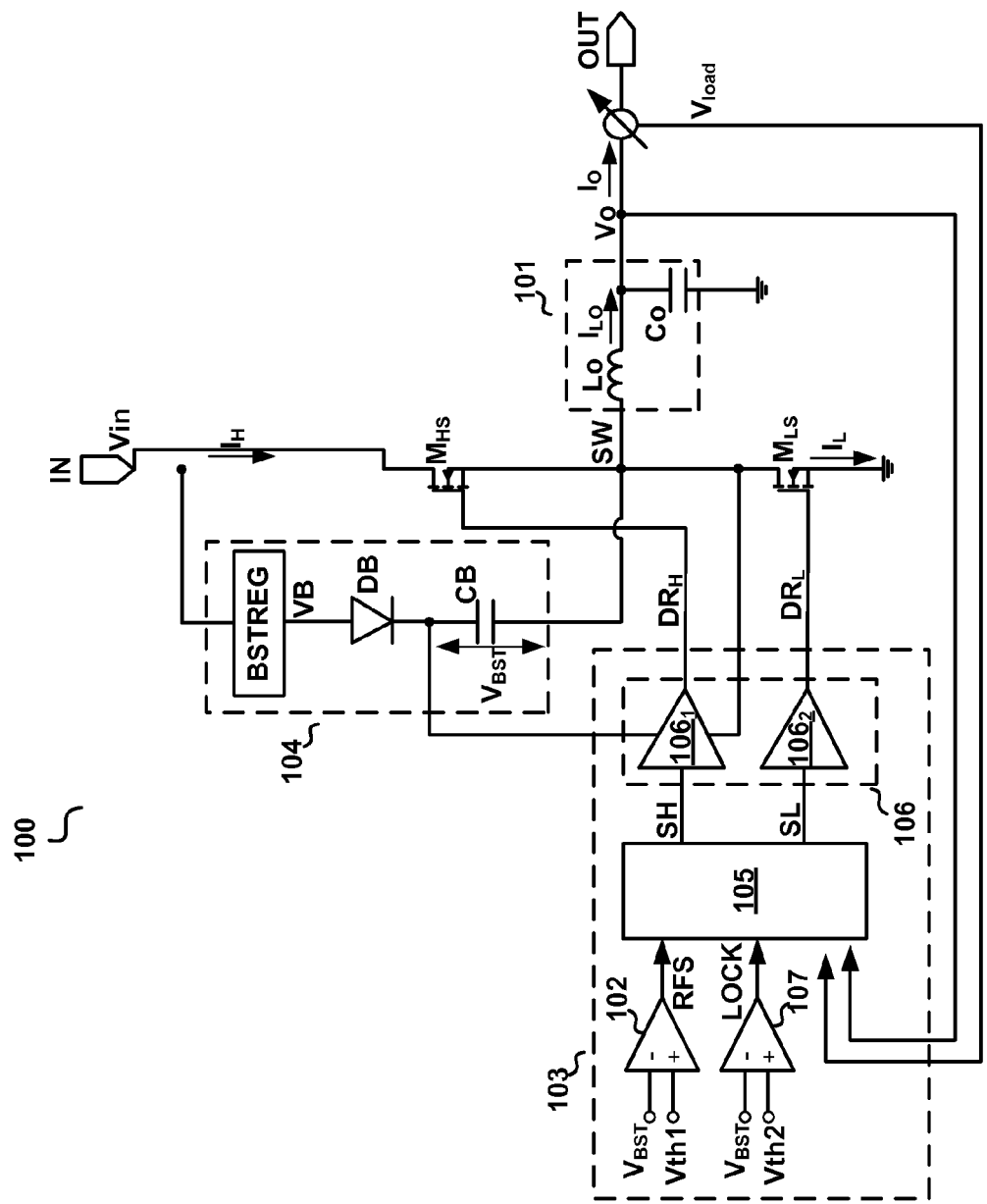
FIG. 2 illustrates a schematic diagram of a power converter 100 in accordance with an exemplary embodiment of the present invention.

FIG. 2 illustrates a schematic diagram of a power converter 100 in accordance with an exemplary embodiment of the present invention. The power converter 100 may comprise an input port IN configured to receive an input voltage Vin; an output port OUT configured to provide an output voltage Vo and an output current Io for supplying a load. The power converter 100 further comprises a switch module illustrated as to comprise a high side switch $M_{HS}$ and a low side switch $M_{LS}$ coupled in series between the input terminal IN and a reference ground GND, wherein the high side switch $M_{HS}$ and the low side switch $M_{LS}$ has a common connection SW referred to in the following as a switching output terminal SW, providing a switching voltage $V_{SW}$. The power converter 100 further comprises an output filter 101 coupled between the switching output terminal SW and the output port OUT to convert the switching voltage $V_{SW}$ into the smoothed output voltage Vo. The power converter 100 further comprises a bootstrap circuit 102 and a control circuit 103. The bootstrap circuit 102 may at least comprise a bootstrap capacitor CB coupled to the input port IN and the low side switch $M_{LS}$, and the bootstrap circuit 102 is configured to charge the bootstrap capacitor CB when the low side switch $M_{LS}$ is turned on, to provide a bootstrap voltage $V_{BST}$. The control circuit 103 may at least comprise a bootstrap input terminal configured to receive the bootstrap voltage $V_{BST}$, and an output control terminal configured to provide an enhanced high side driving signal $DR_H$ to the high side switch $M_{HS}$ to drive the high side switch $M_{HS}$ switching on and off periodically. The control circuit 103 is further configured to controlling the charging of the bootstrap capacitor CB through regulating the on and off switching of the high side switch $M_{HS}$ and the low side switch $M_{LS}$ based on the bootstrap voltage $V_{BST}$.

In the exemplary embodiment of the present invention of FIG. 2, the power converter 100 is configured to have a buck (step-down) type topology and may be referred to as a buck (step down) switching regulator circuit. The high side switch $M_{HS}$ and the low side switch $M_{LS}$ are illustrated as to comprise MOSFETs. The output filter 101 is illustrated as to comprise an inductive energy storage component Lo coupled between the switching output terminal SW and the output port OUT, and a capacitive energy storage component Co coupled between the output port OUT and the reference ground GND. During the switching on and off of the high side switch $M_{HS}$ and the low side switch $M_{LS}$, a high side switching current $I_H$ flows through the high side switch $M_{HS}$, and an inductor current $I_{LO}$ flows through the inductive energy storage component Lo. However, the ordinary artisan should understand that the embodiment of FIG. 2 is not intended to be limiting. For example, in other embodiments, the high side switch $M_{HS}$ may comprise other controllable switching device such as JFET, BJT, IGBT etc. Similarly, the low side switch $M_{LS}$ may also comprise other switching device, including controllable MOSFET, JFET, IGBT, freewheeling diode etc. In still other embodiments, the power converter 100 may have other converter topologies and may be configured as other types of switching converters, such as boost type, buck-boost type, flyback type etc.

In accordance with an embodiment, the control circuit 103 is configured to further receive a bootstrap refresh threshold (a first threshold) signal Vth1, and to compare the bootstrap voltage $V_{BST}$ with the first threshold signal Vth1 to provide a bootstrap refresh signal RFS. If the bootstrap voltage $V_{BST}$ drops lower than the first threshold signal Vth1, which indicates that the bootstrap voltage $V_{BST}$ is too low to enhance the driving capability of the high side driving signal $DR_H$, the high side switch $M_{HS}$ can not be driven on/switched on/turned on normally/completely. In an exemplary embodiment of the present invention, the bootstrap refresh signal RFS may have a first logic state (e.g., logic high in the example of FIG. 2) when the bootstrap voltage $V_{BST}$ drops lower than the first threshold signal Vth1. In this situation, the control circuit 103 is configured in response to the bootstrap refresh signal RFS to regulate the high side switch $M_{HS}$ and the low side switch $M_{LS}$ to switch on and off complementarily with a substantially constant switching frequency. In this way, the low side switch $M_{LS}$ can have a proper on time during each switching cycle to enable the bootstrap capacitor CB to be recharged, and after several switching cycles the electrical charges on the bootstrap capacitor CB are gradually accumulated and the bootstrap voltage $V_{BST}$ is gradually increased until it is higher than the first threshold signal Vth1. The term "switch on and off complementarily/in complementary/in a complementary manner" used in this disclosure means that when the high side switch $M_{HS}$ is turned on, the low side switch is turned off, and vice versa. When the bootstrap voltage $V_{BST}$ exceeds the first threshold signal Vth1, which indicates that the bootstrap voltage $V_{BST}$ is high enough for enhancing the driving capacity of the high side driving signal $DR_H$, the high side switch $M_{HS}$ can be driven on/switched on/turned on normally/completely. In an exemplary embodiment of the present invention, the bootstrap refresh signal RFS may have a second logic state (e.g., logic low in the example of FIG. 2) when the bootstrap voltage $V_{BST}$ is increased higher than the first threshold signal Vth1. In this situation, the control circuit 103 is configured in response to the bootstrap refresh signal RFS to regulate the high side switch $M_{HS}$ and the low side switch $M_{LS}$ to switch on and off according to the output voltage Vo and the load condition (e.g., no load, light load, normal load, heavy load or full load etc.) at the output port OUT. For instance, when the bootstrap voltage $V_{BST}$ is higher than the first threshold signal Vth1, under normal load or relatively heavy load condition, the control circuit 103 is configured to control the high side switch $M_{HS}$ and the low side switch $M_{LS}$ to switch on and off in complementary with a substantially constant frequency in pulse width modulation (PWM) mode according to the output voltage Vo and the load condition; while under relatively light or no load condition, the control circuit 103 is configured to control the high side switch $M_{HS}$ and the low side switch $M_{LS}$ to switch on and off in pulse frequency modulation (PFM) mode with a variational frequency (generally smaller than the constant frequency) to reduce power loss of the power converter 100.

In an exemplary embodiment of the present invention, when the bootstrap voltage $V_{BST}$ is increased higher than the first threshold signal Vth1, the control circuit 103 is configured in response to the bootstrap refresh signal RFS to regulate the high side switch $M_{HS}$ and the low side switch $M_{LS}$ to switch on and off complementarily according to the output voltage Vo and the output current Io, because the output current Io can actually indicate the load condition at the output port OUT of the power converter 100. A larger output current Io indicates a heavier load condition while a smaller output current Io indicates a lighter load condition. For instance, a relatively large output current Io corresponds to a relatively heavy load condition, a relatively small output current Io corresponds to a relatively light load condition, and a substantially zero output current Io corresponds to a no load condition.

In accordance with the various embodiments of the present invention described with reference to FIG. 2, the control circuit 103 is configured to control the charging/recharging of the bootstrap capacitor CB through regulating the high side switch $M_{HS}$ and the low side switch $M_{LS}$ to switch on and off in complementary based on the bootstrap voltage $V_{BST}$, so that the bootstrap voltage $V_{BST}$ can be refreshed/restored in time to enable the control circuit 103 to provide the enhanced high side driving signal $DR_H$ based on the bootstrap voltage $V_{BST}$ in order to drive the high side switch $M_{HS}$ switching normally. Since the regulating of the on and off switching of the high side switch $M_{HS}$ and the low side switch $M_{LS}$ is at least partially based on the bootstrap voltage $V_{BST}$, the control circuit 103 is able to change the on and off switching parameters such as the on time and the switching frequency of the high side switch $M_{HS}$ and the low side switch $M_{LS}$ immediately according to the status of the bootstrap voltage $V_{BST}$, so that when the bootstrap voltage $V_{BST}$ drops too low (e.g., lower than the first threshold signal Vth1), the low side switch $M_{LS}$ can have enough chance to turn on for charging the bootstrap capacitor CB in order to refresh the bootstrap voltage $V_{BST}$.

In accordance with an embodiment of the present invention, the first threshold signal Vth1 may comprise a first low threshold $V_{L1}$ and a first high threshold $V_{H1}$, wherein the first low threshold $V_{L1}$ is higher than a ground potential of the reference ground GND and lower than the first high threshold $V_{H1}$. In this exemplary embodiment, if the bootstrap voltage $V_{BST}$ drops lower than the first low threshold $V_{L1}$, the bootstrap refresh signal RFS changes to the first logic state (e.g., logic high in the example of FIG. 2), and the control circuit 103 is configured to regulate the high side switch $M_{HS}$ and the low side switch $M_{LS}$ to switch on and off complementarily with a substantially constant switching frequency in response to the bootstrap refresh signal RFS. In this way, the bootstrap capacitor CB can be recharged during each switching cycle when the low side switch $M_{LS}$ is on to refresh the bootstrap voltage $V_{BST}$ gradually. When the bootstrap voltage $V_{BST}$ is charged or refreshed to be higher than the first high threshold $V_{H1}$, the bootstrap refresh signal RFS changes to the second logic state (e.g., logic low in the example of FIG. 2), and the control circuit 103 is configured to regulate the high side switch $M_{HS}$ and the low side switch $M_{LS}$ to switch on and off according to the output voltage Vo and the load condition (e.g., the output current Io indicating the load condition) at the output port OUT. According to this exemplary embodiment, the first threshold signal Vth1 has a hysteresis between the first low threshold $V_{L1}$ and the first high threshold $V_{H1}$, so as to reduce the possibility of false trigger due to small vibrations of the bootstrap voltage $V_{BST}$.

In accordance with an exemplary embodiment of the present invention, still referring to FIG. 2, the bootstrap capacitor CB is coupled between the input port IN and the switching output terminal SW and is configured to be charged when the low side switch $M_{LS}$ is on to refresh the bootstrap voltage $V_{BST}$.

In accordance with an exemplary embodiment of the present invention, still referring to FIG. 2, the bootstrap circuit 102 may further comprise a bootstrap switch DB, coupled between the input port IN and the bootstrap capacitor CB. The bootstrap switch DB is configured to switch on and off in synchronous with the low side switch $M_{LS}$. That is to say, when the low side switch $M_{LS}$ is switched on, the bootstrap switch DB is also switched on to provide a charging path for the bootstrap capacitor CB from the input port IN to the reference ground GND, when the low side switch $M_{LS}$ is switched off, the bootstrap switch DB is also switched off to improve the ruggedness of the bootstrap circuit 102. In FIG. 2, the bootstrap switch DB is illustrated as to comprise a diode. However, one having ordinary skill in the art should understand that this is not intended to be limiting. In other embodiments, for example, the bootstrap switch DB may comprise other controllable switching devices, such as MOSFET, JFET, and BJT etc. In the example where the bootstrap switch DB comprises a controllable switching device, the control circuit 103 is further configured to provide a driving signal to the controllable switching device DB for controlling it to switch on and off in synchronous with the low side switch $M_{LS}$.

In accordance with an exemplary embodiment of the present invention, still referring to FIG. 2, the bootstrap circuit 102 may further comprise a bootstrap regulator BSTREG. The bootstrap regulator BSTREG having a regulator input terminal coupled to the input port IN and a regulator output terminal coupled to the bootstrap capacitor CB, is configured to regulate the input voltage Vin into a bootstrap supply voltage VB appropriate for charging the bootstrap capacitor CB. In this embodiment, a maximum value that the bootstrap voltage $V_{BST}$ can be charged to is limited to the bootstrap supply voltage VB. For example, assuming the input voltage Vin is 12V, and a 5V bootstrap voltage $V_{BST}$ is desired, the bootstrap regulator BSTREG can be configured to regulate the 12V input voltage Vin into a 5V bootstrap supply voltage VB so that the bootstrap voltage $V_{BST}$ can be increased to 5V (rather than 12V without the bootstrap regulator BSTREG) through charging the bootstrap capacitor CB. In an exemplary embodiment, the bootstrap regulator BSTREG may comprise a linear low drop out voltage regulator.

In accordance with an exemplary embodiment of the present invention, still referring to FIG. 2, the control circuit 103 may comprise a first comparison module 104. The first comparison module 104 may at least comprise a first comparing input terminal, a second comparing input terminal and a first comparing output terminal, wherein the first comparing input terminal (e.g., the "−" input terminal of 104 illustrated in FIG. 2) is configured to receive the bootstrap voltage $V_{BST}$, the second comparing input terminal (e.g., the "+" input terminal of 104 illustrated in FIG. 2) is configured to receive the first threshold signal Vth1, and the first comparison module 104 is configured to compare the bootstrap voltage $V_{BST}$ with the first threshold signal Vth1 to provide the bootstrap refresh signal RFS at the first comparing output terminal.

In accordance with an exemplary embodiment of the present invention, still referring to FIG. 2, the control circuit 103 may further comprise a control module 105. The control module 105 may at least have a first control input terminal configured to receive the bootstrap refresh signal RFS, and is configured to regulate the on and off switching of the high side switch $M_{HS}$ and the low side switch $M_{LS}$ at least partially based on the bootstrap refresh signal RFS so as to control the charging of the bootstrap capacitor CB.

In accordance with an exemplary embodiment of the present invention, still referring to FIG. 2, the control module 105 may further have a second control input terminal and a third control input terminal, wherein the second control input terminal is configured to sense the output voltage Vo, and the third control input terminal is configured to sense the output current Io indicating the load condition at the output port OUT. The control module 105 is configured to provide a high side control signal SH and a low side control signal SL based on the bootstrap refresh signal RFS, the output voltage Vo and the output current Io. When the bootstrap refresh signal RFS is at the first logic state (e.g., logic high in the example of FIG. 2), the high side control signal SH and the low side control signal SL are respectively configured to regulate the high side switch $M_{HS}$ and the low side switch $M_{LS}$ to switch on and off complementarily with a substantially constant switching frequency, so that the low side switch $M_{LS}$ has an appropriate on time during each switching cycle to charge the bootstrap capacitor CB for refreshing the bootstrap voltage $V_{BST}$. When the bootstrap refresh signal RFS is at the second logic state (e.g., logic low in the example of FIG. 2), the high side control signal SH and the low side control signal SL are respectively configured to regulate the high side switch $M_{HS}$ and the low side switch $M_{LS}$ to switch on and off according to the output voltage Vo and the output current Io.

In accordance with an exemplary embodiment of the present invention, the control module 105 may be configured to sense the output current Io through sensing the inductor current $I_{LO}$ or the high side switching current $I_H$, and to provide a load signal $V_{load}$ indicating the load condition at the output port OUT based on the inductor current $I_{LO}$ or the high side switching current $I_H$.

In accordance with an exemplary embodiment of the present invention, still referring to FIG. 2, the control circuit 103 may further comprise a driving module 106 having a first driving input terminal, a second driving input terminal, a third driving input terminal, a first driving output terminal and a second driving output terminal, wherein the first driving input terminal is configured to receive the bootstrap voltage $V_{BST}$, the second driving input terminal is configured to receive the high side control signal SH, the third driving input terminal is configured to receive the low side control signal SL. The driving module 106 is configured to provide the enhanced high side driving signal $DR_H$ at the first driving output terminal based on the bootstrap voltage $V_{BST}$ and the high side control signal SH, and is further configured to provide an enhanced low side driving signal $DR_L$ at the second driving output terminal based on the low side control signal SL, wherein the high side driving signal $DR_H$ is configured to drive the high side switch $M_{HS}$ to switch on and off, while the low side driving signal $DR_L$ is configured to drive the low side switch $M_{LS}$ to switch on and off.

In accordance with an exemplary embodiment of the present invention, the driving module 106 may comprise a high side driver $106_H$ and a low side driver $106_L$. The high side driver $106_H$ is configured to receive the bootstrap voltage $V_{BST}$ and the high side control signal SH, and to provide the enhanced high side driving signal $DR_H$, wherein the bootstrap voltage $V_{BST}$ may act as a supply voltage for the high side driver $106_H$. The low side driver $106_L$ is configured to receive the low side control signal SL and to provide the enhanced low side driving signal $DR_L$. According to an embodiment, the high side driver $106_H$ may comprise one or more inverters, and the bootstrap voltage $V_{BST}$ may be used to supply the inverter(s). Analogously, the low side driver $106_L$ may also comprise one or more inverters.

In accordance with an exemplary embodiment of the present invention, still referring to FIG. 2, the control circuit 103 may further comprise an under voltage lock out (UVLO) circuit 107 having a first lock input terminal, a second lock input terminal and a lock output terminal. The first lock input terminal (e.g., the "−" input terminal of 107 in FIG. 2) is configured to receive the bootstrap voltage $V_{BST}$, the second lock input terminal (e.g., the "+" input terminal of 107 in FIG. 2) is configured to receive a bootstrap under voltage lock out threshold (a second threshold) signal Vth2. The UVLO circuit 107 is configured to compare the bootstrap voltage $V_{BST}$ with the second threshold signal Vth2 to provide an under voltage indicating signal LOCK at the lock output terminal based on the comparison results. If the bootstrap voltage $V_{BST}$ is lower than the second threshold signal Vth2, which indicates that the bootstrap voltage $V_{BST}$ is too low to support generating the driving signal $DR_H$, the under voltage indicating signal LOCK may have a first logic state (e.g., logic high in the example of FIG. 2), and the control circuit 103 is configured to turn both the high side switch $M_{HS}$ and the low side switch $M_{LS}$ off in response to the first logic state of the under voltage indicating signal LOCK to keep the high side switch $M_{HS}$ and the low side switch $M_{LS}$ from switching until the bootstrap voltage $V_{BST}$ recovers to be higher than the second threshold signal Vth2. If the bootstrap voltage $V_{BST}$ is higher than the second threshold signal Vth2, which indicates that the bootstrap voltage $V_{BST}$ is able to support the generation of the driving signal $DR_H$, the under voltage indicating signal LOCK may have a second logic state (e.g., logic low in the example of FIG. 2), and the control circuit 103 is configured to enable the on and off switching of the high side switch $M_{HS}$ and the low side switch $M_{LS}$ in response to the second logic state of the under voltage indicating signal LOCK. In accordance with an embodiment, the second threshold signal Vth2 is higher than the first threshold signal Vth1. The UVLO circuit 107 is provided to keep the high side switch $M_{HS}$ and the low side switch $M_{LS}$ both off during the period when the bootstrap voltage $V_{BST}$ is lower than the second threshold signal Vth2 and has not yet been refreshed, so as to improve the operation safety of the power converter 100.

Figure 3:
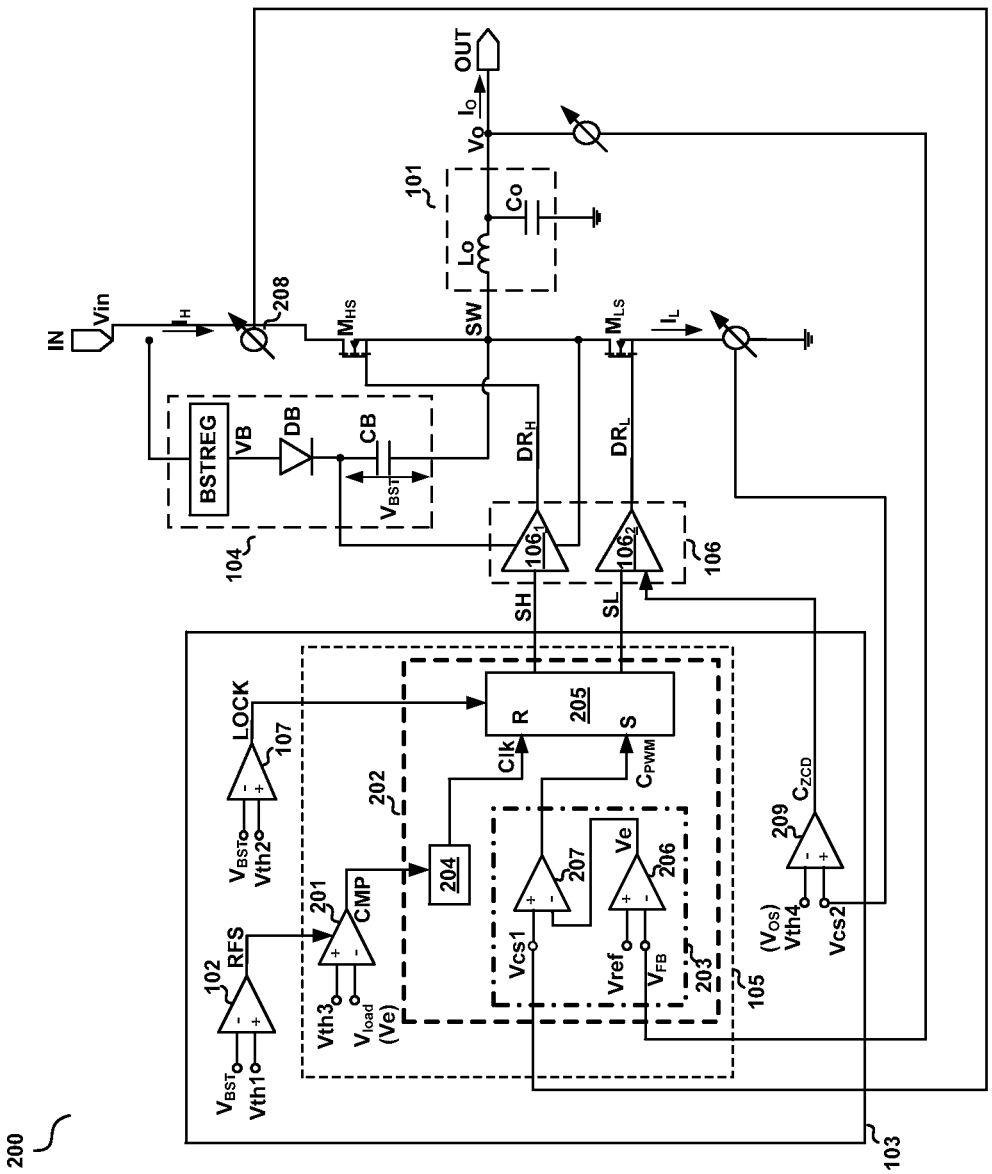
FIG. 3 illustrates a schematic diagram of a power converter 200 in accordance with an alternative exemplary embodiment of the present invention.

FIG. 3 illustrates a schematic diagram of a power converter 200 in accordance with an exemplary embodiment of the present invention. Components or structures in the power converter 200 shown in FIG. 3 with substantially the same functions as those of the power converter 100 shown in FIG. 2 are identified by the same reference labels for the sake of simplicity.

Referring to FIG. 3, in accordance with an exemplary embodiment of the present invention, the control module 105 may comprise a second comparison module 201. The second comparison module 201 may at least comprise a third comparing input terminal, a fourth comparing input terminal and a second comparing output terminal, wherein the third comparing input terminal (e.g., the "−" input terminal of 201 illustrated in FIG. 3) is configured to receive the load signal $V_{load}$ indicating the output current Io or the load condition at the output port OUT, the fourth comparing input terminal (e.g., the "+" input terminal of 201 illustrated in FIG. 3) is configured to receive a light load threshold signal (a third threshold signal) Vth3 indicative of a threshold value for determining whether light load condition or no load condition occurs at the output port OUT. The second comparison module 201 is configured to compare the load signal $V_{load}$ with the third threshold signal Vth3 to provide a light load indicating signal CMP at the second comparing output terminal. If the load signal $V_{load}$ is higher than the third threshold signal Vth3, which indicates that the load at the output port OUT is relatively heavy and the power converter 200 is operating in normal load condition or heavy load condition, the light load indicating signal CMP may have a first logic state (e.g., logic high in the example of FIG. 3). If the load signal $V_{load}$ is lower than the third threshold signal Vth3, which indicates that the load at the output port OUT is relatively light and the power converter 200 is operating in light load condition or no load condition, the light load indicating signal CMP may have a second logic state (e.g., logic low in the example of FIG. 3).

In accordance with an exemplary embodiment of the present invention, when the light load indicating signal CMP is at the first logic state, the control circuit 103 is configured to regulate the high side switch $M_{HS}$ and the low side switch $M_{LS}$ to switch on and off in complementary with a substantially constant frequency $F_C$ in PWM mode, wherein the pulse width of the high side driving signal $DR_H$, which represents the on time of the high side switch $M_{HS}$ in each switching cycle, is modulated by the output voltage Vo and the output current Io. When the light load indicating signal CMP is at the second logic state, the control circuit 103 is configured to regulate the high side switch $M_{HS}$ and the low side switch $M_{LS}$ to switch on and off in PFM mode with a variational frequency $F_S$, wherein the variational frequency $F_S$ is modulated by the load signal $V_{load}$ and changes with the load signal $V_{load}$ in the same direction, i.e., during load variation at the output port OUT, the variational frequency $F_S$ increases according to the increase of the load signal $V_{load}$ and decreases according to the decrease of the load signal $V_{load}$. In this way, the power consumption of the power converter 200 in light load condition or no load condition can be reduced to improve the conversion efficiency.

In accordance with an exemplary embodiment of the present invention, still referring to FIG. 3, the second comparison module 201 further comprises an enable input terminal configured to receive the bootstrap refresh signal RFS. The bootstrap refresh signal RFS is provided to the second comparison module 201 for controlling the enable and disable of this module. According to an embodiment, when the bootstrap refresh signal RFS is at the first logic state (i.e., the bootstrap voltage $V_{BST}$ is lower than the first threshold signal Vth1), the second comparison module 201 is disabled, and the light load indicating signal CMP is set and held at the first logic state. Thus, in this situation, even if the load signal $V_{load}$ drops lower than the third threshold signal Vth3 (i.e., the output port OUT is in light load or no load condition), the light load indicating signal CMP is still held at the first logic state, and accordingly the control circuit 103 still regulates the high side switch $M_{HS}$ and the low side switch $M_{LS}$ to switch on and off in complementary with the substantially constant frequency $F_C$ in PWM mode. Consequently, the low side switch $M_{LS}$ has an appropriate on time during each switching cycle to enable the bootstrap capacitor CB to be charged until, e.g., after several switching cycles, the bootstrap voltage $V_{BST}$ is refreshed higher than the first threshold signal Vth1. When the bootstrap refresh signal RFS is at the second logic state (i.e., the bootstrap voltage $V_{BST}$ is refreshed higher than the first threshold signal Vth1), the second comparison module 201 is enabled, and the light load indicating signal CMP can be at the first logic state or at the second logic state depending on the load signal $V_{load}$ being respectively higher or lower than the third threshold signal Vth3. Accordingly, in this situation, the control circuit 103 regulates the high side switch $M_{HS}$ and the low side switch $M_{LS}$ to switch on and off in complementary with the substantially constant frequency $F_C$ in PWM mode when the light load indicating signal CMP is at the first logic state, and regulates the high side switch $M_{HS}$ and the low side switch $M_{LS}$ to switch on and off in PFM mode with the variational frequency $F_S$ when the load indicating signal CMP is at the second logic state.

In accordance with an exemplary embodiment of the present invention, still referring to FIG. 3, the bootstrap refresh signal RFS is configured to control the enable and disable of the second comparison module 201 through controlling the third threshold signal Vth3. For instance, the bootstrap refresh signal RFS is configured to decrease the third threshold signal Vth3 (e.g., to connect the third threshold signal Vth3 to the reference ground GND) when the bootstrap refresh signal RFS is at the first logic state, and to increase the third threshold signal Vth3 to its normal value (e.g., to disconnect the third threshold signal Vth3 from the reference ground GND) when the bootstrap refresh signal RFS is at the second logic state. In this way, if the bootstrap refresh signal RFS is at the first logic state, since the third threshold signal Vth3 is decreased (e.g., to ground potential), the light load indicating signal CMP provided by the second comparison module 201 can be substantially held at the first logic state in despite of the status of the load signal $V_{load}$ (i.e., the second comparison module 201 is disabled). If the bootstrap refresh signal RFS changes to the second logic state, since the third threshold signal Vth3 is recovered to its normal value accordingly, the light load indicating signal CMP can be at the first logic state or at the second logic state according to the comparison results between the load signal $V_{load}$ and the third threshold signal Vth3 (i.e., the second comparison module 201 is enabled). In the example illustrated in FIG. 3, the third threshold signal Vth3 is connected to the reference ground GND via a threshold control switch ST having a control terminal configured to receive the bootstrap refresh signal RFS, wherein the bootstrap refresh signal RFS turns the threshold control switch ST on when it is at the first logic state, and turns the threshold control switch ST off when it is at the second logic state.

In accordance with an exemplary embodiment of the present invention, still referring to FIG. 3, the control module 105 may further comprise a pulse width modulation (PWM) module 202. The PWM module 202 may at least comprise a first modulation input terminal, a second modulation input terminal, a third modulation input terminal, a first modulation output terminal and a second modulation output terminal. The first modulation input terminal is configured to receive the light load indicating signal CMP, the second modulation input terminal is configured to receive a first feedback signal $V_{FB}$ indicating the output voltage Vo, and the third modulation input terminal is configured to receive a second feedback signal $V_{CS1}$ indicating the output current Io or the inductor current $I_{LO}$ or the high side switching current $I_H$. The PWM module 202 is configured to provide the high side control signal SH and the low side control signal SL respectively at the first modulation output terminal and second modulation output terminal based on the first feedback signal $V_{FB}$ and the second feedback signal $V_{CS1}$, wherein the high side control signal SH and the low side control signal SL are pulse signals having complementary logic levels (e.g., when the high side control signal SH is logic high, the low side control signal is logic low, and vice versa), and wherein the pulse width of the high side control signal is modulated by the first feedback signal $V_{FB}$ and the second feedback signal $V_{CS1}$. That is to say, in this circumstance, the high side control signal SH and the low side control signal SL are pulse width modulated.

In accordance with an exemplary embodiment of the present invention, the PWM module 202 is further configured to regulate the high side control signal SH and the low side control signal SL according to the light load indicating signal CMP. When the light load indicating signal CMP is at the first logic state (i.e., the load signal $V_{load}$ is higher than the third threshold signal Vth3), the high side control signal SH and the low side control signal SL are held to be pulse width modulated or changed from pulse frequency modulated to pulse width modulated, so that the high side switch $M_{HS}$ and the low side switch $M_{LS}$ are driven to switch on and off in complementary with the constant frequency $F_C$ in PWM mode based on the high side control signal SH and the low side control signal SL. When the light load indicating signal CMP is at the second logic state (i.e., the load signal $V_{load}$ is lower than the third threshold signal Vth3), the high side control signal SH and the low side control signal SL are changed from pulse width modulated to pulse frequency modulated (i.e., the frequency of the high side control signal SH and the low side control signal SL is varied), so that the high side switch $M_{HS}$ and the low side switch $M_{LS}$ are driven to switch on and off in PFM mode with the variational frequency $F_S$ based on the high side control signal SH and the low side control signal SL.

In accordance with an exemplary embodiment of the present invention, when the light load indicating signal CMP is at the first logic state, the PWM module 202 is configured to enable the high side control signal SH and the low side control signal SL to control the high side switch $M_{HS}$ and the low side switch $M_{LS}$ to switch on and off with the substantially constant frequency $F_C$ in PWM mode. When the light load indicating signal CMP is at the second logic state, the PWM module 202 is configured to disable the high side control signal SH and the low side control signal SL so as to turn off both the high side switch $M_{HS}$ and the low side switch $M_{LS}$ (i.e., to stop the high side switch $M_{HS}$ and the low side switch $M_{LS}$ from switching). In this fashion, the PWM module 202 actually regulates the high side control signal SH and the low side control signal SL to change between pulse width modulated and pulse frequency modulated according to the logic status of the light load indicating signal CMP, so that the switching on and off of the high side switch $M_{HS}$ and the low side switch $M_{LS}$ are driven to change between constant frequency PWM mode and vary frequency PFM mode based on the high side control signal SH and the low side control signal SL.

In accordance with an exemplary embodiment of the present invention, still referring to FIG. 3, the PWM module 202 may comprise a pulse width modulator 203, a frequency controller 204 and a logic controller 205. The pulse width modulator 203 is configured to receive the first feedback signal $V_{FB}$ and the second feedback signal $V_{CS1}$ respectively at a first modulator input terminal and a second modulator input terminal, and is configured to generate a PWM signal $C_{PWM}$ at a modulator output terminal based on the first feedback signal $V_{FB}$ and the second feedback signal $V_{CS1}$. The frequency controller 204 is configured to receive the light load indicating signal CMP at a frequency control terminal, and to provide a first clock signal CLK having a clock frequency regulated by the light load indicating signal CMP, wherein the clock frequency is set substantially at the constant frequency $F_C$ when the light load indicating signal CMP is at the first logic state, and wherein the clock frequency is changed to the variational frequency $F_S$ modulated by the load signal $V_{load}$ when the light load indicating signal CMP is at the second logic state. The logic controller 205 has a set terminal S configured to receive the PWM signal $C_{PWM}$ and a reset terminal R configured to receive the first clock signal CLK. The logic controller 205 is configured to provide the high side control signal SH and the low side control signal SL based on the PWM signal $C_{PWM}$ and the first clock signal CLK, wherein the high side control signal SH and the low side control signal SL are pulse signals having complementary logic levels, and wherein a pulse width of the high side control signal is regulated by the PWM signal $C_{PWM}$ and a pulse frequency of the high side control signal is regulated by the first clock signal CLK.

In accordance with an exemplary embodiment of the present invention, still referring to FIG. 3, the pulse width modulator 203 may comprise an error amplifier 206 and a PWM comparator 207. The error amplifier 206 may have a first amplifier input terminal (e.g., the "−" input terminal of 206 in FIG. 3) configured to receive the first feedback signal $V_{FB}$, a second amplifier input terminal (e.g., the "+" input terminal of 206 in FIG. 3) configured to receive a reference signal Vref indicative of a desired value of the output voltage Vo, and an amplifier output terminal configured to provide a difference signal Ve indicative of a difference between the output voltage Vo and its desired value based on the first feedback signal $V_{FB}$ and the reference signal Vref. The PWM comparator 207 may have a first comparator input terminal (e.g., the "−" input terminal of 207 in FIG. 3) configured to receive the difference signal Ve, a second comparator input terminal (e.g., the "+" input terminal of 207 in FIG. 3) configured to receive the second feedback signal $V_{CS1}$, and a comparator output terminal configured to provide the PWM signal $C_{PWM}$ based on comparison of the difference signal Ve and the second feedback signal $V_{CS1}$.

In accordance with an exemplary embodiment of the present invention, still referring to FIG. 3, the control circuit 103 is configured to sense the high side switching current $I_H$ to provide the second feedback signal $V_{CS1}$. In an embodiment, the control circuit 103 may further comprise a high side current sense (HSCS) module 208 coupled to the high side switch $M_{HS}$, wherein the HSCS module 208 is configured to sense the high side switching current $I_H$ and to provide the second feedback signal $V_{CS1}$ proportional to the high side switching current $I_H$.

In accordance with an exemplary embodiment of the present invention, still referring to FIG. 3, the load signal $V_{load}$ provided to the second comparison module 201 may comprise the difference signal Ve. That is to say, the difference signal Ve may function as the load signal $V_{load}$ since the difference signal Ve are generated based on the first feedback signal $V_{FB}$ indicative of the output voltage Vo and the second feedback signal $V_{CS1}$ indicative of the output current Io and thus actually includes load information.

Figure 4:
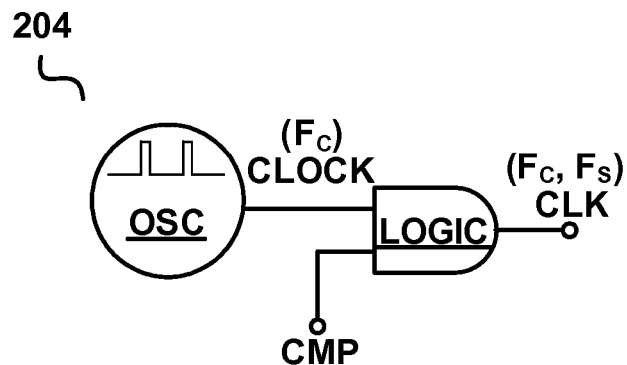
FIG. 4 illustrates a schematic diagram of a frequency control circuit 204 in accordance with an exemplary embodiment of the present invention.

In accordance with an exemplary embodiment of the present invention, referring to FIG. 4, the frequency controller 204 may comprise an oscillator OSC and a logic circuit LOGIC. The oscillator OSC is configured to provide a second clock signal CLOCK having the substantially constant frequency $F_C$. The logic circuit LOGIC is configured to receive the second clock signal CLOCK and the light load indicating signal CMP respectively at a first logic input terminal and a second logic input terminal, and is configured to provide the first clock signal CLK at a logic output terminal, wherein the first clock signal CLK comprises the second clock signal CLOCK when the light load indicating signal CMP is at the first logic state (e.g., logic high in the present embodiment), and wherein the first clock signal CLK is set to logic low when the light load indicating signal CMP is at the second logic state (e.g., logic low in the present embodiment). That is to say, the logic circuit LOGIC outputs the second clock signal CLOCK as the first clock signal CLK when the light load indicating signal CMP is at the first logic state, and sets the first clock signal CLK to logic low when the light load indicating signal CMP is at the second logic state. In this means, the second clock signal CLOCK is shielded from being output as the first clock signal CLK when the light load indicating signal CMP is at the second logic state. Thus, the first clock signal CLK skips several pulses of the second clock signal CLOCK, thereby having the variational frequency $F_S$, during the period when the light load indicating signal CMP is at the second logic state.

Turning back to FIG. 3, in accordance with an exemplary embodiment of the present invention, the control circuit 103 may further comprise a zero-crossing detection (ZCD) module 209. The ZCD module 209 may at lease have a first detection input terminal (e.g., the "+" input terminal of 209 in FIG. 3) configured to receive a third feedback signal $V_{CS2}$, a second detection input terminal (e.g., the "−" input terminal of 209 in FIG. 3) configured to receive a low side current limit threshold (a fourth threshold) signal Vth4, and a detection output terminal configured to provide a zero-crossing indicating signal $C_{ZCD}$ based on comparison between the third feedback signal $V_{CS2}$ and the fourth threshold signal Vth4, wherein the third feedback signal $V_{CS2}$ is indicative of a low side switching current $I_L$ flowing through the low side switch $M_{LS}$. According to an embodiment, when the third feedback signal $V_{CS2}$ is higher than the fourth threshold signal Vth4, the zero-crossing indicating signal $C_{ZCD}$ has a first logic state (e.g., logic high in the example of FIG. 3) and the control circuit 103 is configured to enable the low side switch $M_{LS}$ to switch on and off based on the first logic state of the zero-crossing indicating signal $C_{ZCD}$; when the third feedback signal $V_{CS2}$ is lower than the fourth threshold signal Vth4, the zero-crossing indicating signal $C_{ZCD}$ has a second logic state (e.g., logic low in the example of FIG. 3) and the control circuit 103 is configured to turn the low side switch $M_{LS}$ off (i.e., to disable the low side switch $M_{LS}$ to switch on and off) based on the second logic state of the zero-crossing indicating signal $C_{ZCD}$.

In accordance with an exemplary embodiment of the present invention, still referring to FIG. 3, the control circuit 103 is configured to couple the zero-crossing indicating signal $C_{ZCD}$ to the driving module 106 (e.g., to the low side driver 106O so as to enable or disable the on and off switching of the low side switch $M_{LS}$. For instance, in an embodiment, the low side driver $106_L$ may further comprise an enable input terminal configured to receive the zero-crossing indicating signal $C_{ZCD}$. When the zero-crossing indicating signal $C_{ZCD}$ is at the first logic state, the low side driver $106_L$ is enabled to drive the low side switch $M_{LS}$ to switch on and off, when the zero-crossing indicating signal $C_{ZCD}$ is at the second logic state, the low side driver $106_L$ is disabled to stop driving the low side switch $M_{LS}$ so that the low side switch $M_{LS}$ is turned off to stop switching.

In accordance with an exemplary embodiment of the present invention, the fourth threshold signal Vth4 is set to be substantially zero. Therefore, the low side switch $M_{LS}$ is turned off when the third feedback signal $V_{CS2}$ is lower than zero (i.e., when the low side switching current $I_L$ is lower than zero) in order to reduce the switching loss resulted from the low side switch $M_{LS}$ and to improve the conversion efficiency of the power converter 200.

In accordance with an exemplary embodiment of the present invention, the fourth threshold signal Vth4 may have an offset value $V_{OS}$ which is lower than zero but is quite close to zero. That is to say, the amplitude of the offset value $V_{OS}$ is relatively small and can be chosen appropriately according to design and application requirements. For example, the offset value $V_{OS}$ can be selected according to a minimum peak current that the high side switching current $I_H$ must be kept to when the power converter 200 is operating at ultra light load condition or no load condition (i.e., when the output current Io drawn by the load is ultra small or substantially zero). According to this embodiment, setting the fourth threshold signal Vth4 to the offset value $V_{OS}$ which is lower than zero but is quite close to zero indicates that the low side switching current $I_L$ is allowed to be negative and close to zero (i.e., the low side switching current $I_L$ can flow reversely with a quite small value which is close to zero). In this circumstance, the high side switching current $I_H$ can have a higher than zero but close to zero value to compensate the lower than zero value of the low side switching current $I_L$ even when the power converter 200 is operating at ultra light load condition or no load condition. This can be beneficial for refreshing the bootstrap voltage $V_{BST}$ during the power converter 200 operating in light load, ultra light load or no load conditions (the light load indicating signal CMP is at the first logic state). Because in this condition, if the bootstrap refresh signal RFS changes to the first logic state (which indicates that the bootstrap voltage $V_{BST}$ drops lower than the first threshold signal Vth1), the high side switch $M_{HS}$ and the low side switch $M_{LS}$ regulated to switch on and off in complementary with the substantially constant frequency $F_C$ may both have a relatively large on time (e.g., about 50%) in an switching cycle, and thus the bootstrap capacitor CB can have an appropriate duration (during the on time of the low side switch $M_{LS}$) to be charged in each switching cycle so that the bootstrap voltage $V_{BST}$ can be refreshed as quickly as possible to a high enough value (e.g., to be higher than the first threshold signal Vth1 in the present embodiment) suitable for ensuring the high side switch $M_{HS}$ to switch normally. In spite of beneficial to the refresh of the bootstrap voltage $V_{BST}$, the conduction loss and switching loss resulted from the low side switch $M_{LS}$ due to the allowable reverse flowing of the low side switching current $I_L$ is almost negligible because the offset value $V_{OS}$ is quite close to zero, which means that the allowed negative (reverse) value of the low side switching current $I_L$ is quite small. Thus, the conversion efficiency is almost uninfluenced.

Figure 5:
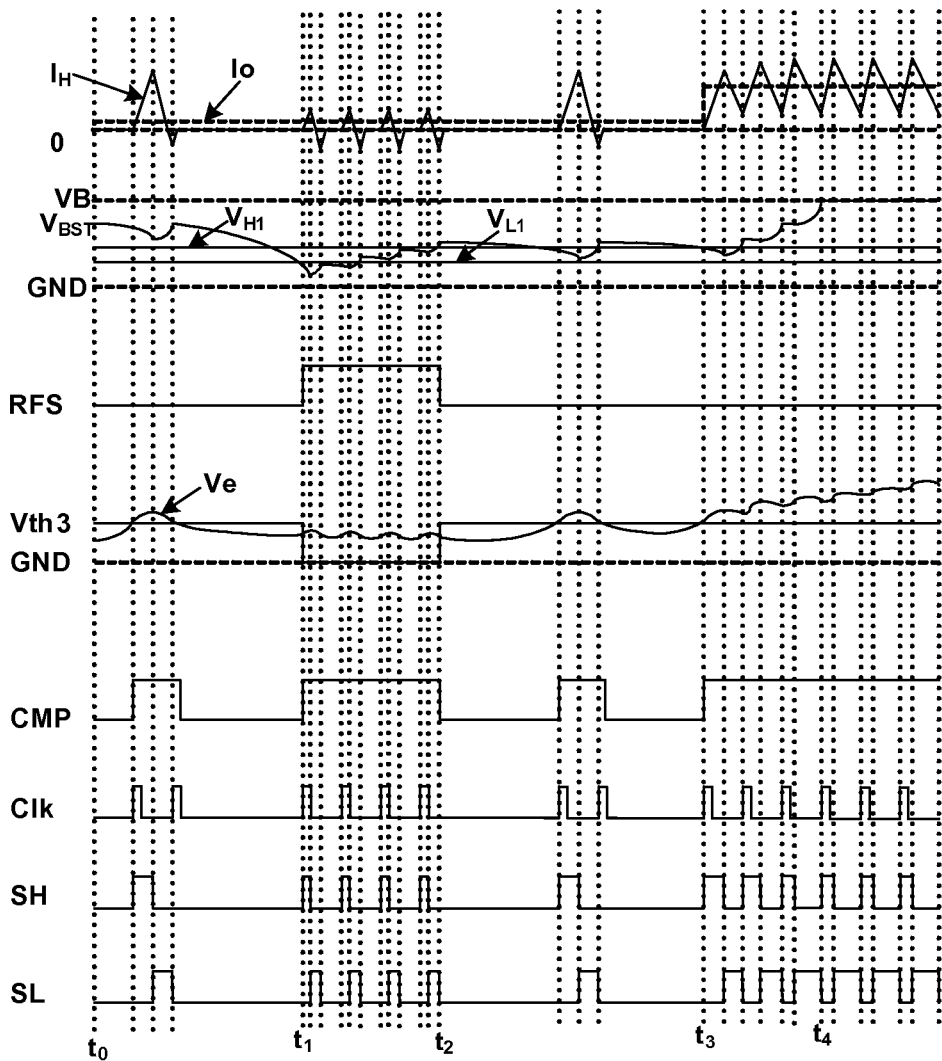
FIG. 5 illustrates an operation waveform diagram of the power converter 200 in accordance with an exemplary embodiment of the present invention.

FIG. 5 illustrates an operation waveform diagram of the power converter 200 in accordance with an exemplary embodiment of the preset invention. In the following, the power converter 200 will be explained in more detail referring to FIG. 3 and FIG. 5. In the illustrative embodiment of FIG. 5, the control circuit 103 is configured to sense the high side switching current $I_H$ to provide the second feedback signal $V_{CS1}$ indicative of the output/load current Io. The difference signal Ve from the error amplifier 206 is provided to the second comparison module 201 as the load signal $V_{load}$. This is because the difference signal Ve actually functions as a comparison reference to the second feedback signal $V_{CS1}$ which is proportional to the high side switching current $I_H$ during operation of the PWM comparator 207, thus limits the peak current value of high side switching current $I_H$ and can represent the load condition of the power converter 200. However, providing the difference signal Ve as the load signal $V_{load}$ is just an example, those having ordinary skill in the art should understand that this is not intended to be limiting, and any other suitable signals carrying the load information, such as the load current Io, the inductor current $I_{LO}$, the high side switching current $I_H$, or their peak values or average values, or their sampling signals etc. can be provided as the load signal $V_{load}$. In the example of FIG. 5, the load current Io (illustrated by the dotted line) is relatively small in the duration from t0 to t3, which indicates that the load at the output port OUT is relatively light or the power converter 200 is operating in light load condition, while at t3, the load current Io rises to a higher value, which indicates that the load at the output port OUT increases to be relatively heavy or the power converter 200 changes to operate in heavy load condition.

Referring to FIG. 5, in the duration of t0 to t1, the bootstrap voltage $V_{BST}$ is higher than the first low threshold $V_{L1}$. Thus, the bootstrap refresh signal RFS provided by the first comparison module 104 has the second logic state (illustrated as logic low in FIG. 5), which enables the second comparison module 201. Therefore, the second comparison module 201 operates normally to compare the load signal $V_{load}$ (the difference signal Ve in this example) with the third threshold signal Vth3, and the light load indicating signal CMP can have the first logic state or the second logic state depending on the difference signal Ve being respectively higher or lower than the third threshold signal Vth3. Accordingly, the control circuit 103 regulates the high side switch $M_{HS}$ and the low side switch $M_{LS}$ to switch on and off in PFM mode to reduce power consumption of the power converter 200 in light load condition. More concretely, further referring to FIG. 3 and FIG. 4, when the difference signal Ve is higher than the third threshold signal Vth3, the light load indicating signal CMP is at the first logic state (illustrated as logic high in FIG. 5), thus the frequency controller 204 outputs the second clock signal CLOCK as the first clock signal CLK (the first clock signal CLK which determines the switching frequency of the high side switch $M_{HS}$ and the low side switch $M_{LS}$ in this case can be viewed as to copy several pulses of the second clock signal CLOCK having the substantially constant frequency $F_C$). When the difference signal Ve drops to be lower than the third threshold signal Vth3, the light load indicating signal CMP changes to the second logic state (illustrated as logic low in FIG. 5), accordingly the frequency controller 204 sets the first clock signal CLK to logic low (the first clock signal CLK in this case can be viewed as to skip several pulses of the second clock signal CLOCK). Therefore, the first clock signal CLK actually has a variational frequency (labeled as $F_S$ throughout this specification for simplicity) varying according to the load signal $V_{load}$ (Ve in this example). Consequently, the control module 105 regulates the high side switch $M_{HS}$ and the low side switch $M_{LS}$ to switch on and off in PFM mode based on the first clock signal CLK.

At time t1, the bootstrap voltage $V_{BST}$ drops to be lower than the first low threshold $V_{L1}$. Thus, the bootstrap refresh signal RFS provided by the first comparison module 104 changes to the first logic state (illustrated as logic high in FIG. 5), which disables the second comparison module 201 (through decreasing the third threshold signal Vth3 to reference ground potential in the example of FIG. 5). Therefore, the light load indicating signal CMP provided by the second comparison module 201 is substantially held at the first logic state (illustrated as logic high in FIG. 5). In this circumstance, the first clock signal CLK generated from the frequency controller 204 can be viewed as to start copying the pulses of the second clock signal CLOCK again, having the substantially constant frequency $F_C$. Consequently, the control module 105 regulates the high side switch $M_{HS}$ and the low side switch $M_{LS}$ to switch on and off complementarily in PWM mode with the substantially constant frequency $F_C$ based on the first clock signal CLK. Thus, the bootstrap capacitor CB can be charged in each switching cycle during the low side switch $M_{LS}$ is turned on. Until after several switching cycles, e.g., at time t2, the bootstrap voltage $V_{BST}$ is charged/refreshed to be higher than the first high threshold $V_{H1}$ again. The bootstrap refresh signal RFS accordingly recovers to have the second logic state (illustrated as logic low in FIG. 5), thereby enabling the second comparison module 201 again.

From time t2 to t3, the bootstrap voltage $V_{BST}$ remains higher than the first low threshold $V_{L1}$. The power converter 200 operates in the same way as from time t0 to t1, the control circuit 103 is thus configured to regulate the high side switch $M_{HS}$ and the low side switch $M_{LS}$ to switch on and off in PFM mode. At time t3, the load current Io increases (i.e., the load at the output port OUT gets heavier), and the load signal $V_{load}$ (the difference signal Ve in this example) indicating the load current Io turns to be higher than the third threshold signal Vth3 resulting in the light load indicating signal CMP changing to the first logic state (illustrated as logic high in FIG. 5). From time t3 on, the light load indicating signal CMP is illustrated to remain at the first logic state (i.e., the load remains to be relatively heavy). Therefore, the first clock signal CLK provided by the frequency controller 204 copies the second clock signal CLOCK having the substantially constant frequency $F_C$, and thus the control module 105 regulates the high side switch $M_{HS}$ and the low side switch $M_{LS}$ to switch on and off in PWM mode with the substantially constant frequency $F_C$ based on the first clock signal CLK. Consequently, in heavy load condition, the bootstrap capacitor CB can be charged during the on time of the low side switch $M_{LS}$ in each switching cycle, the bootstrap voltage $V_{BST}$ increases gradually till it reaches the bootstrap supply voltage VB (regulated by the bootstrap regulator BSTREG).

In accordance with the various embodiments described with reference to FIGS. 3 to 5, the control circuit 103 is configured to control the charging/recharging of the bootstrap capacitor CB through regulating the high side switch $M_{HS}$ and the low side switch $M_{LS}$ to switch on and off in complementary based on the bootstrap voltage $V_{BST}$, so that the bootstrap voltage $V_{BST}$ can be refreshed/restored in time once the bootstrap voltage VBST drops too low (e.g., lower than the first threshold signal Vth1).

In accordance with the various embodiments described with reference to FIGS. 3 to 5, the first comparison module 104 is configured to compare the bootstrap voltage $V_{BST}$ with the bootstrap refresh threshold (the first threshold) signal Vth1 to provide the bootstrap refresh signal RFS. The bootstrap refresh signal RFS is configured to enable or disable the second comparison module 201. If the bootstrap voltage $V_{BST}$ is higher than the first threshold signal Vth1 (or higher than the first high threshold $V_{H1}$ of the first threshold signal Vth1 in an embodiment), which indicates that the bootstrap voltage $V_{BST}$ is high enough for enhancing the high side driving signal $DR_H$ to drive the high side switch $M_{HS}$ to switch on and off normally, the bootstrap refresh signal RFS enables the second comparison module 201. If the bootstrap voltage $V_{BST}$ is lower than the first threshold signal Vth1 (or lower than the first low threshold $V_{L1}$ of the first threshold signal Vth1 in an embodiment), which indicates that the bootstrap voltage $V_{BST}$ is too low to enhance the high side driving signal $DR_H$ and the high side switch $M_{HS}$ can not be driven to switch on and off normally, the bootstrap refresh signal RFS disables the second comparison module 201. The second comparison module 201 may be regarded as a load comparison module, which detects the load condition (e.g., relatively light load condition or relatively heavy load condition) of the power converter 200. When the second comparison module 201 is enabled, if the load signal $V_{load}$ (e.g., the difference signal Ve in an embodiment) indicative of the output/load current Io is lower than the light load threshold (the third threshold) signal Vth3, which indicates that the load current Io is relatively small and the power converter 200 operates at relatively light load condition (e.g., light load condition, ultra light load condition or no load condition occurs at the output port OUT), the control circuit 103 is configured to regulate the high side switch $M_{HS}$ and the low side switch $M_{LS}$ to switch on and off in PFM mode with the variational frequency $F_S$ modulated by the load signal $V_{load}$ and changes with the load signal $V_{load}$ in the same direction; if the load signal $V_{load}$ (e.g., the difference signal Ve in an embodiment) is higher than the light load threshold (the third threshold) signal Vth3, which indicates that the load current Io is relatively large and the power converter 200 operates at relatively heavy load condition (e.g., normal load condition, heavy load condition, ultra heavy load condition or full load condition occurs at the output port OUT), the control circuit 103 is configured to regulate the high side switch $M_{HS}$ and the low side switch $M_{LS}$ to switch on and off in PWM mode with the substantially constant frequency $F_C$. When the second comparison module 201 is disabled, the control circuit 103 is configured to regulate the high side switch $M_{HS}$ and the low side switch $M_{LS}$ to switch on and off in complementary in PWM mode with the substantially constant frequency $F_C$, in spite of the status of the load signal $V_{load}$, or the load current Io or the load condition at the output port OUT of the power converter 200. Therefore, once the bootstrap voltage $V_{BST}$ drops too low (e.g., the bootstrap voltage $V_{BST}$ is lower than the first threshold signal Vth1 or lower than the first low threshold $V_{L1}$ in an embodiment) to enhance the high side driving signal $DR_H$ for driving the high side switch $M_{HS}$ normally, the bootstrap refresh signal RFS disables the second comparison module 201 so that the high side switch $M_{HS}$ and the low side switch $M_{LS}$ are driven to switch on and off in complementary in PWM mode with the substantially constant frequency $F_C$. In this way, the bootstrap capacitor CB can be charged/recharged during the on time of the low side switch $M_{LS}$ in each switching cycle until after several switching cycles the bootstrap voltage $V_{BST}$ is refreshed to be high enough (e.g., higher than the first threshold signal Vth1 or higher than the first high threshold $V_{H1}$ in an embodiment) for enhancing the high side driving signal $DR_H$ to drive the high side switch $M_{HS}$ normally.

In accordance with the various embodiments described with reference to FIGS. 3 to 5, once the bootstrap voltage $V_{BST}$ drops lower than the first threshold signal Vth1 (e.g., at time t1 of FIG. 5, the bootstrap voltage $V_{BST}$ drops lower than the first low threshold $V_{L1}$), the control circuit 103 is configured to immediately regulate the high side switch $M_{HS}$ and the low side switch $M_{LS}$ to switch on and off in PWM mode with the substantially constant frequency $F_C$ so as to charge the bootstrap capacitor CB (e.g., the operation mode from t1 to t2 illustrated in FIG. 5), even if the load at the output port OUT of the power converter 200 is relatively light (i.e., the load current Io is relatively small or the load signal $V_{load}$ indicative of the output current Io is lower than the third threshold signal Vth3), and the high side switch $M_{HS}$ and the low side switch $M_{LS}$ should have operated in PFM mode (e.g., the operation mode from t0 to t3 illustrated in FIG. 5). Once the bootstrap voltage $V_{BST}$ is refreshed to be higher than the first threshold signal Vth1 (e.g., at time t2 of FIG. 5, the bootstrap voltage $V_{BST}$ surpasses the first high threshold $V_{H1}$) after several switching cycles, the control circuit 103 is configured to regulate the high side switch $M_{HS}$ and the low side switch $M_{LS}$ to restore switching on and off in PFM mode which they should have been operating in. During the period from t1 to t2, when the bootstrap voltage $V_{BST}$ is refreshed, since the peak value of the high side switching current $I_H$ is controlled to be quite small (e.g., through the ZCD module 209), the output voltage Vo will only have quite small negligible ripples, which is acceptable. In addition, the switching loss and the conduction loss resulted from the small peak current switching of the high side switch $M_{HS}$ and the low side switch $M_{LS}$ is very small, and thus the power conversion efficiency is substantially uninfluenced. Therefore, the power converters in accordance with the various embodiments of the present invention can operate efficiently in various load conditions and also in the circumstance where the output voltage Vo is close to the input voltage Vin without having the problem of not being able to refresh the bootstrap voltage $V_{BST}$. The control circuit 103 according to various embodiments of the present invention can control the bootstrap voltage $V_{BST}$ to refresh in time for supporting to drive the high side switch $M_{HS}$ to switch on and off normally without causing large spikes in the output voltage Vo and without influencing the power conversion efficiency of the power converter comprising the control circuit 103.

The advantages of the various embodiments of the bootstrap refresh control circuit 103 and the power converter (e.g., 100 or 200) comprising the same of the present invention are not confined to those described above. These and other advantages of the various embodiments of the present invention will become more apparent upon reading the whole detailed descriptions and studying the various figures of the drawings.

Figure 6:
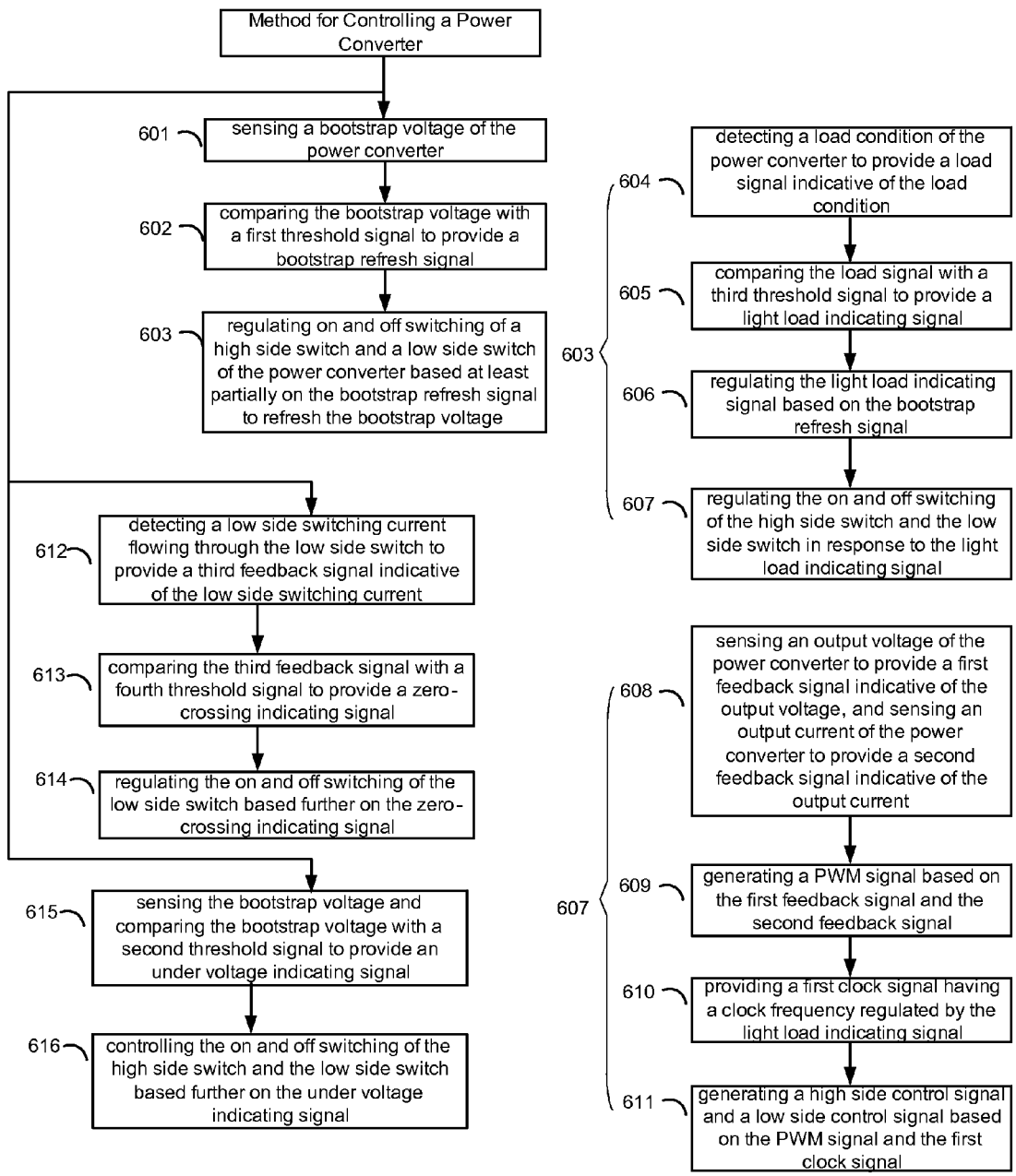
FIG. 6 illustrates a flow diagram of a method for controlling a power converter in accordance with an exemplary embodiment of the present invention.

FIG. 6 illustrates a flow diagram of a method for controlling a power converter in accordance with an exemplary embodiment of the present invention. The power converter (such as the power converters 100 and 200) may comprise a high side switch (e.g., $M_{HS}$ in FIGS. 2 and 3), a low side switch (e.g., $M_{LS}$ in FIGS. 2 and 3) and a bootstrap capacitor (e.g., CB in FIGS. 2 and 3) for providing a bootstrap voltage (e.g., $V_{BST}$) to supply a high side driver of the high side switch. The power converter is configured to receive an input voltage (Vin) and to provide an output voltage (Vo) and an output current (Io) based on driving the high side switch and the low side switch to switch on and off according to the output voltage and the output current. The method for controlling the power converter may comprise: step 601, sensing the bootstrap voltage across the bootstrap capacitor; step 602, comparing the bootstrap voltage with a first threshold signal (a bootstrap refresh threshold signal) to provide a bootstrap refresh signal based on the comparison of the bootstrap voltage and the first threshold signal; and step 603, regulating the on and off switching of the high side switch and the low side switch based at least partially on the bootstrap refresh signal in order to control charging/recharging of the bootstrap capacitor to refresh the bootstrap voltage.

In accordance with an exemplary embodiment of the present invention, at step 602, the bootstrap refresh signal may have a first logic state when the bootstrap voltage is lower than the first threshold signal and may have a second logic state when the bootstrap voltage is higher than the first threshold signal; at step 603, if the bootstrap refresh signal is at the first logic state, regulating the high side switch and the low side switch to switch on and off in complementary with a substantially constant frequency, if the bootstrap refresh signal is at the second logic state, regulating the high side switch and the low side switch to switch on and off according to the output voltage and the output current.

In accordance with an exemplary embodiment of the present invention, at step 602, the first threshold signal may comprise a first low threshold (e.g., $V_{L1}$) and a first high threshold (e.g., $V_{H1}$), wherein the first low threshold is higher than a ground potential of a reference ground and lower than the first high threshold. According to an embodiment, if the bootstrap voltage drops lower than the first low threshold, the bootstrap refresh signal changes to the first logic state, if the bootstrap voltage is charged or refreshed to be higher than the first high threshold, the bootstrap refresh signal changes to the second logic state.

In accordance with an exemplary embodiment of the present invention, the step 603 may comprise: step 604, detecting a load condition of the power converter to provide a load signal (e.g., $V_{load}$) indicative of the load condition or indicative of the output current; step 605, comparing the load signal with a third threshold signal (a light load threshold signal) to provide a light load indicating signal (e.g., CMP), wherein the light load indicating signal having a first logic state and a second logic state; step 606, regulating the light load indicating signal based on the bootstrap refresh signal, wherein when the bootstrap voltage is lower than the first threshold signal (when the bootstrap refresh signal has the first logic state), holding the light load indicating signal at the first logic state, and wherein when the bootstrap voltage is higher than the first threshold signal (when the bootstrap refresh signal has the second logic state), setting the light load indicating signal to the first logic state if the load signal is higher than the third threshold signal and setting the light load indicating signal to the second logic state if the load signal is lower than the third threshold signal; and step 607, regulating the on and off switching of the high side switch and the low side switch in response to the light load indicating signal, wherein the high side switch and the low side switch are controlled to switch on and off in PWM mode with the substantially constant frequency if the light load indicating signal is at the first logic state, and wherein the high side switch and the low side switch are controlled to switch on and off in PFM mode with the variational frequency if the light load indicating signal is at the second logic state.

In accordance with an exemplary embodiment of the present invention, at step 607, the high side switch and the low side switch are controlled to switch on and off in PWM mode with the substantially constant frequency if the light load indicating signal is at the first logic state, and both the high side switch and the low side switch are turned off to stop switching if the light load indicating signal is at the second logic state.

In accordance with an exemplary embodiment of the present invention, the step 607 may comprise: step 608, sensing the output voltage to provide a first feedback signal (e.g., $V_{FB}$) indicative of the output voltage, and sensing the output current (through e.g., sensing a high side switching current flowing through the high side switch) to provide a second feedback signal (e.g., $V_{CS1}$) indicative of the output current; step 609, generating a PWM signal (e.g., $C_{PWM}$) based on the first feedback signal and the second feedback signal; step 610, providing a first clock signal (e.g., CLK) having a clock frequency regulated by the light load indicating signal, wherein the clock frequency is set at the substantially constant frequency ($F_C$) when the light load indicating signal is at the first logic state, and wherein the clock frequency is changed to the variational frequency ($F_S$) modulated by the load signal when the light load indicating signal is at the second logic state; and step 611, generating a high side control signal (e.g., SH) and a low side control signal (e.g., SL) based on the PWM signal and the first clock signal, wherein the high side control signal and the low side control signal are pulse signals having complementary logic levels, and wherein a pulse width of the high side control signal is regulated by the PWM signal and a pulse frequency of the high side control signal is regulated by the first clock signal, and wherein when the light load indicating signal is at the first logic state, the high side control signal and the low side control signal are pulse modulated with the substantially constant frequency so that the high side switch and the low side switch are driven to switch on and off in complementary with the constant frequency in PWM mode, and wherein when the light load indicating signal is at the second logic state, the high side control signal and the low side control signal are changed from pulse width modulated to pulse frequency modulated so that the high side switch and the low side switch are driven to switch on and off in PFM mode with the variational frequency.

In accordance with an exemplary embodiment of the present invention, the method for controlling the power converter may further comprise: step 612, detecting a low side switching current (e.g., $I_L$) flowing through the low side switch to provide a third feedback signal (e.g., $V_{CS2}$) indicative of the low side switching current; step 613, comparing the third feedback signal with a fourth threshold signal (a low side current limit threshold signal) to provide a zero-crossing indicating signal (e.g., $C_{ZCD}$), wherein when the third feedback signal is higher than the fourth threshold signal, the zero-crossing indicating signal has a first logic state, and wherein when the third feedback signal is lower than the fourth threshold signal, the zero-crossing indicating signal has a second logic state; and step 614, further regulating the on and off switching of the low side switch based on the zero-crossing indicating signal, wherein the low side switch is enabled to switch on and off based on the first logic state of the zero-crossing indicating signal and is disabled (e.g., turned off) to stop the on and off switching based on the second logic state of the zero-crossing indicating signal.

In accordance with an exemplary embodiment of the present invention, the fourth threshold signal Vth4 may have an offset value $V_{OS}$ which is lower than zero but is quite close to zero.

In accordance with an exemplary embodiment of the present invention, the method for controlling the power converter may further comprise: step 615, sensing the bootstrap voltage and comparing the bootstrap voltage with a second threshold signal (a bootstrap under voltage lock out threshold signal) to provide an under voltage indicating signal (e.g., LOCK), wherein the under voltage indicating signal may have a first logic state when the bootstrap voltage is lower than the second threshold signal, and wherein the under voltage indicating signal may have a second logic state when the bootstrap voltage is higher than the second threshold signal; and step 616, further controlling the on and off switching of the high side switch and the low side switch based on the under voltage indicating signal, wherein the high side switch and the low side switch are turned off in response to the first logic state of the under voltage indicating signal to disable the on and off switching of the high side switch and the low side switch (i.e., to keep the high side switch and the low side switch from switching), and wherein the high side switch and the low side switch are enabled to switch on and off in response to the second logic state of the under voltage indicating signal.

Methods and steps of controlling the power converter described above in the various embodiments of the present invention are illustrative and not intended to be limiting. Well known controlling steps, operating processes, and parameters etc. are not described in detail to avoid obscuring aspects of the invention. Those skilled in the art should understand that the steps described in the embodiments with reference to FIG. 6 may be implemented in different orders and are not limited to the embodiments described.

Although a bootstrap refresh control circuit, a power converter comprising the bootstrap refresh control circuit and associated control methods are illustrated and explained based on a buck type power converter according to various embodiments of the present invention, this is not intended to be limiting. Persons of ordinary skill in the art will understand that the circuits, methods and principles taught herein may apply to any other suitable types of power converters, such as boost type power converter, buck-boost type power converter or flyback type power converter etc.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

I claim:

1. A bootstrap refresh control circuit for a power converter, wherein the power converter comprises a high side switch, a low side switch and a bootstrap capacitor for providing a bootstrap voltage to supply a high side driver of the high side switch, and wherein the power converter is configured to receive an input voltage and to provide an output voltage and an output current based on driving the high side switch and the low side switch to switch on and off, the bootstrap refresh control circuit comprising:
a first comparison module having a first comparing input terminal, a second comparing input terminal and a first comparing output terminal, wherein the first comparing input terminal is configured to receive the bootstrap voltage, the second comparing input terminal is configured to receive a first threshold signal, and the first comparison module is configured to compare the bootstrap voltage with the first threshold signal to provide a bootstrap refresh signal at the first comparing output terminal; and
a control module having a first control input terminal configured to receive the bootstrap refresh signal, wherein the control module is configured to regulate the on and off switching of the high side switch and the low side switch at least partially based on the bootstrap refresh signal so as to control charging of the bootstrap capacitor, and wherein the control module is configured to regulate the high side switch and the low side switch to switch on and off in complementary with a substantially constant frequency when the bootstrap voltage is lower than the first threshold signal
further wherein
the bootstrap refresh signal has a first logic state when the bootstrap voltage is lower than the first threshold signal and has a second logic state when the bootstrap voltage is higher than the first threshold signal; and wherein
the control module further has a second control input terminal configured to sense the output voltage, and a third control input terminal configured to sense the output current; and wherein
the control module is configured to regulate the high side switch and the low side switch to switch on and off in complementary with the substantially constant frequency in response to the first logic state of the bootstrap refresh signal, and is configured to regulate the high side switch and the low side switch to switch on and off according to the output voltage and the output current in response to the second logic state of the bootstrap refresh signal.

2. The bootstrap refresh control circuit of claim 1, wherein the first threshold signal comprises a first low threshold and a first high threshold, wherein the first low threshold is higher than a ground potential and lower than the first high threshold; and wherein
the bootstrap refresh signal is at the first logic state if the bootstrap voltage drops lower than the first low threshold, and is at the second logic state if the bootstrap voltage is charged higher than the first high threshold.

3. The bootstrap refresh control circuit of claim 1, wherein the control module comprises:
a second comparison module having an enable input terminal, a third comparing input terminal, a fourth comparing input terminal and a second comparing output terminal, wherein the enable input terminal is configured to receive the bootstrap refresh signal, the third comparing input terminal is configured to receive a load signal indicative of the output current, the fourth comparing input terminal is configured to receive a third threshold signal, and wherein the second comparison module is configured to compare the load signal with the third threshold signal to provide a light load indicating signal at the second comparing output terminal; and wherein
the bootstrap refresh signal is configured to disable the second comparison module when the bootstrap voltage is lower than the first threshold signal, and is configured to enable the second comparison module when the bootstrap voltage is higher than the first threshold signal; and wherein
if the second comparison module is enabled, the light load indicating signal has a first logic state when the load signal is higher than the third threshold signal, and has a second logic state when the load signal is lower than the third threshold signal; and wherein
if the second comparison module is disabled, the light load indicating signal is set and held at the first logic state; and wherein
the control module is configured to regulate the high side switch and the low side switch to switch on and off in complementary with the substantially constant frequency in pulse width modulation mode in response to the first logic state of the light load indicating signal, and is configured to regulate the high side switch and the low side switch to switch on and off with a variational frequency in pulse frequency modulation mode in response to the second logic state of the light load indicating signal.

4. The bootstrap refresh control circuit of claim 3, wherein the variational frequency is modulated by the load signal to increase according to the increase of the load signal and to decrease according to the decrease of the load signal.

5. The bootstrap refresh control circuit of claim 3, wherein the control module further comprises:
a pulse width modulation ("PWM") module having a first modulation input terminal, a second modulation input terminal, a third modulation input terminal, a first modulation output terminal and a second modulation output terminal, wherein the first modulation input terminal is configured to receive the light load indicating signal, the second modulation input terminal is configured to receive a first feedback signal indicating the output voltage, and the third modulation input terminal is configured to receive a second feedback signal indicating the output current; and wherein the PWM module is configured to provide a high side control signal and a low side control signal respectively at the first modulation output terminal and the second modulation output terminal based on the first feedback signal and the second feedback signal, and wherein the high side control signal and the low side control signal are pulse signals having complementary logic levels; and wherein the PWM module is further configured to regulate the high side control signal and the low side control signal according to the light load indicating signal, wherein when the light load indicating signal is at the first logic state, the high side control signal and the low side control signal are pulse width modulated, and wherein when the light load indicating signal is at the second logic state, the high side control signal and the low side control signal are pulse frequency modulated; and wherein the control module is configured to drive the high side switch and the low side switch to switch on and off in complementary with the constant frequency in pulse width modulation mode based on the high side control signal and the low side control signal when the light load indicating signal is at the first logic state; and wherein the control module is configured to drive the high side switch and the low side switch to switch on and off in pulse frequency modulation mode with the variational frequency based on the high side control signal and the low side control signal when the light load indicating signal is at the second logic state.

6. The bootstrap refresh control circuit of claim 5, wherein when the light load indicating signal is at the first logic state, the PWM module is configured to enable the high side control signal and the low side control signal to control the high side switch and the low side switch to switch on and off with the substantially constant frequency in PWM mode; and wherein when the light load indicating signal is at the second logic state, the PWM module is configured to disable the high side control signal and the low side control signal so as to turn off both the high side switch and the low side switch.

7. The bootstrap refresh control circuit of claim 5, wherein the PWM module comprises:

a pulse width modulator, configured to receive the first feedback signal and the second feedback signal respectively at a first modulator input terminal and a second modulator input terminal, and configured to generate a PWM signal at a modulator output terminal based on the first feedback signal and the second feedback signal;

a frequency controller, configured to receive the light load indicating signal at a frequency control terminal, and to provide a first clock signal having a clock frequency regulated by the light load indicating signal, wherein the clock frequency is set substantially at the constant frequency when the light load indicating signal is at the first logic state, and wherein the clock frequency is changed to the variational frequency modulated by the load signal when the light load indicating signal is at the second logic state; and a logic controller, having a set terminal configured to receive the PWM signal and a reset terminal configured to receive the first clock signal, wherein the logic controller is configured to provide the high side control signal and the low side control signal based on the PWM signal and the first clock signal; and wherein a pulse width of the high side control signal is regulated by the PWM signal and a pulse frequency of the high side control signal is regulated by the first clock signal.

8. The bootstrap refresh control circuit of claim 1, further comprising:

a zero-crossing detection ("ZCD") module having a first detection input terminal configured to receive a third feedback signal indicative of a low side switching current flowing through the low side switch, a second detection input terminal configured to receive a fourth threshold signal, and a detection output terminal configured to provide a zero-crossing indicating signal based on comparison between the third feedback signal and the fourth threshold signal; wherein the zero-crossing indicating signal has a first logic state when the third feedback signal is higher than the fourth threshold signal, and has a second logic state when the third feedback signal is lower than the fourth threshold signal; and wherein the bootstrap refresh control circuit is configured to enable the low side switch to switch on and off based on the first logic state of the zero-crossing indicating signal, and is configured to turn the low side switch off to disable the low side switch from switching based on the second logic state of the zero-crossing indicating signal.

9. The bootstrap refresh control circuit of claim 8, wherein the fourth threshold signal has an offset value lower than zero but quite close to zero.

10. The bootstrap refresh control circuit of claim 1, further comprising:

an under voltage lock out ("UVLO") circuit having a first lock input terminal, a second lock input terminal and a lock output terminal, wherein the first lock input terminal is configured to receive the bootstrap voltage, the second lock input terminal is configured to receive a second threshold signal, and the UVLO circuit is configured to compare the bootstrap voltage with the second threshold signal to provide an under voltage indicating signal at the lock output terminal; and wherein the under voltage indicating signal has a first logic state if the bootstrap voltage is lower than the second threshold signal, and has a second logic state if the bootstrap voltage is higher than the second threshold signal; and wherein the bootstrap refresh control circuit is configured to turn both the high side switch and the low side switch off in response to the first logic state of the under voltage indicating signal to keep the high side switch and the low side switch from switching, and is configured to enable the on and off switching of the high side switch and the low side switch in response to the second logic state of the under voltage indicating signal.

11. A power converter, comprising:

an input port configured to receive an input voltage;

an output port configured to provide an output voltage and an output current;

a high side switch and a low side switch coupled in series between the input port and a reference ground, wherein the high side switch and the low side switch has a common connection forming a switching output terminal, providing a switching voltage;

an output filter coupled between the switching output terminal and the output port to convert the switching voltage into the smoothed output voltage;

a bootstrap circuit comprising a bootstrap capacitor coupled to the input port and the low side switch, wherein the bootstrap circuit is configured to charge the bootstrap capacitor to provide a bootstrap voltage there across when the low side switch is turned on; and a bootstrap refresh control circuit having a bootstrap input terminal configured to receive the bootstrap voltage, and an output control terminal configured to provide an enhanced high side driving signal to the high side switch for driving the high side switch to switch on and off periodically; wherein the bootstrap refresh control circuit is further configured to control the charging of the bootstrap capacitor through regulating the on and off switching of the high side switch and the low side switch based on the bootstrap voltage; and wherein the bootstrap refresh control circuit is further configured to regulate the high side switch and the low side switch to switch on and off in complementary with a substantially constant frequency when the bootstrap voltage is lower than a first threshold signal further wherein the bootstrap refresh control circuit comprises:

a first comparison module having a first comparing input terminal, a second comparing input terminal and a first comparing output terminal, wherein the first comparing input terminal is configured to receive the bootstrap voltage, the second comparing input terminal is configured to receive the first threshold signal, and the first comparison module is configured to compare the bootstrap voltage with the first threshold signal to provide a bootstrap refresh signal at the first comparing output terminal; and a control module having a first control input terminal configured to receive the bootstrap refresh signal, wherein the control module is configured to regulate the on and off switching of the high side switch and the low side switch at least partially based on the bootstrap refresh signal so as to control charging of the bootstrap capacitor.

12. The power converter of claim 11, wherein the bootstrap refresh signal has a first logic state when the bootstrap voltage is lower than the first threshold signal and has a second logic state when the bootstrap voltage is higher than the first threshold signal; and wherein the control module further has a second control input terminal configured to sense the output voltage, and a third control input terminal configured to sense the output current; and wherein the control module is configured to regulate the high side switch and the low side switch to switch on and off in complementary with the substantially constant frequency in response to the first logic state of the bootstrap refresh signal so as to charge the bootstrap capacitor, and is configured to regulate the high side switch and the low side switch to switch on and off according to the output voltage and the output current in response to the second logic state of the bootstrap refresh signal.

13. The power converter of claim 11, wherein the first threshold signal comprises a first low threshold and a first high threshold, wherein the first low threshold is higher than a ground potential of the reference ground and lower than the first high threshold; and wherein the bootstrap refresh signal is at the first logic state if the bootstrap voltage drops lower than the first low threshold, and is at the second logic state if the bootstrap voltage is charged higher than the first high threshold.

14. The power converter of claim 11, wherein the control module comprises:

a second comparison module having an enable input terminal, a third comparing input terminal, a fourth comparing input terminal and a second comparing output terminal, wherein the enable input terminal is configured to receive the bootstrap refresh signal, the third comparing input terminal is configured to receive a load signal indicative of the output current, the fourth comparing input terminal is configured to receive a third threshold signal, and wherein the second comparison module is configured to compare the load signal with the third threshold signal to provide a light load indicating signal at the second comparing output terminal; and wherein the bootstrap refresh signal is configured to disable the second comparison module when the bootstrap voltage is lower than the first threshold signal, and is configured to enable the second comparison module when the bootstrap voltage is higher than the first threshold signal; and wherein if the second comparison module is enabled, the light load indicating signal has a first logic state when the load signal is higher than the third threshold signal, and has a second logic state when the load signal is lower than the third threshold signal; and wherein if the second comparison module is disabled, the light load indicating signal is set and held at the first logic state; and wherein the control module is configured to regulate the high side switch and the low side switch to switch on and off in complementary with the substantially constant frequency in pulse width modulation mode in response to the first logic state of the light load indicating signal, and is configured to regulate the high side switch and the low side switch to switch on and off with a variational frequency in pulse frequency modulation mode in response to the second logic state of the light load indicating signal.

15. The power converter of claim 11, further comprising:

a zero-crossing detection ("ZCD") module having a first detection input terminal configured to receive a third feedback signal indicative of a low side switching current flowing through the low side switch, a second detection input terminal configured to receive a fourth threshold signal, and a detection output terminal configured to provide a zero-crossing indicating signal based on comparison between the third feedback signal and the fourth threshold signal; wherein the zero-crossing indicating signal has a first logic state when the third feedback signal is higher than the fourth threshold signal, and has a second logic state when the third feedback signal is lower than the fourth threshold signal; and wherein the bootstrap refresh control circuit is configured to enable the low side switch to switch on and off based on the first logic state of the zero-crossing indicating signal, and is configured to turn the low side switch off to disable the low side switch from switching based on the second logic state of the zero-crossing indicating signal.

16. The power converter of claim 15, wherein the fourth threshold signal has an offset value lower than zero but quite close to zero.

17. A method for controlling a power converter, wherein the power converter comprises a high side switch, a low side switch and a bootstrap capacitor for providing a bootstrap voltage to supply a high side driver of the high side switch, and wherein the power converter is configured to receive an input voltage and to provide an output voltage and an output current based on driving the high side switch and the low side switch to switch on and off, the method comprising:

sensing the bootstrap voltage across the bootstrap capacitor;

comparing the bootstrap voltage with a first threshold signal to provide a bootstrap refresh signal based on the comparison of the bootstrap voltage and the first threshold signal; and regulating the on and off switching of the high side switch and the low side switch based at least partially on the bootstrap refresh signal in order to control charging of the bootstrap capacitor to refresh the bootstrap voltage; wherein regulating the on and off switching of the high side switch and the low side switch comprises regulating the high side switch and the low side switch to switch on and off in complementary with the substantially constant frequency when the bootstrap voltage is lower than the first threshold signal further wherein the bootstrap refresh signal has a first logic state when the bootstrap voltage is lower than the first threshold signal and has a second logic state when the bootstrap voltage is higher than the first threshold signal; and wherein if the bootstrap refresh signal is at the first logic state, regulating the high side switch and the low side switch to switch on and off in complementary with a substantially constant frequency, if the bootstrap refresh signal is at the second logic state, regulating the high side switch and the low side switch to switch on and off according to the output voltage and the output current.

* * * * *